(12) United States Patent  (10) Patent No.: US 8,703,520 B2
Shinike et al.  (45) Date of Patent: Apr. 22, 2014

(54) PRINTING PLATE AND METHOD FOR MANUFACTURING SOLAR CELL ELEMENT USING THE PRINTING PLATE

(75) Inventors: Yuta Shinike, Omihachiman (JP); Tomonari Sakamoto, Higashiomi (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 13/700,536

(22) PCT Filed: May 27, 2011

(86) PCT No.: PCT/JP2011/062250
§ 371 (c)(1),
(2), (4) Date: Nov. 28, 2012

(87) PCT Pub. No.: WO2011/149067
PCT Pub. Date: Dec. 1, 2011

(65) Prior Publication Data
US 2013/0084676 A1  Apr. 4, 2013

(30) Foreign Application Priority Data
May 28, 2010 (JP) ................................. 2010-122351

(51) Int. Cl.
*H01L 21/00* (2006.01)
(52) U.S. Cl.
USPC .................. 438/73; 438/98; 257/E27.124
(58) Field of Classification Search
USPC .......... 438/61, 62, 83; 257/E27.122, E27.124, 257/E25.004, E25.009
See application file for complete search history.

(56) References Cited

U.S. PATENT DOCUMENTS

2009/0173245 A1  7/2009  Irisawa et al.

FOREIGN PATENT DOCUMENTS

| JP | H11-011033 A | 1/1999 |
|---|---|---|
| JP | H11-042867 A | 2/1999 |
| JP | 2001-113667 A | 4/2001 |
| JP | 2005-111788 A | 4/2005 |
| JP | 2006-341547 A | 12/2006 |
| JP | 2008-135655 A | 6/2008 |
| JP | 2009-272405 A | 11/2009 |
| WO | 2007/117040 A1 | 10/2007 |

OTHER PUBLICATIONS

International Search Report issued by Japan Patent Office for International Application No. PCT/JP2011/062250.

*Primary Examiner* — Cheung Lee
(74) *Attorney, Agent, or Firm* — Procopio, Cory, Harhreaves & Savitch LLP

(57) ABSTRACT

Disclosed are: a printing plate having improved productivity; and a method for manufacturing a solar cell element, which uses the printing plate. A printing plate according to one embodiment of the present invention comprises: a metal plate; a buffer layer that is arranged on one main surface of the metal plate; and a slit that penetrates through the metal plate and the buffer layer. The slit has a first penetrating part that is located in the metal plate, a second penetrating part that is located in the buffer layer, and a bridge that is arranged inside and across the first penetrating part. When viewed in plan from the above-mentioned main surface side, the buffer layer-side opening edge of the first penetrating part is inside the metal plate-side opening edge of the second penetrating part.

11 Claims, 13 Drawing Sheets

FIG. 9
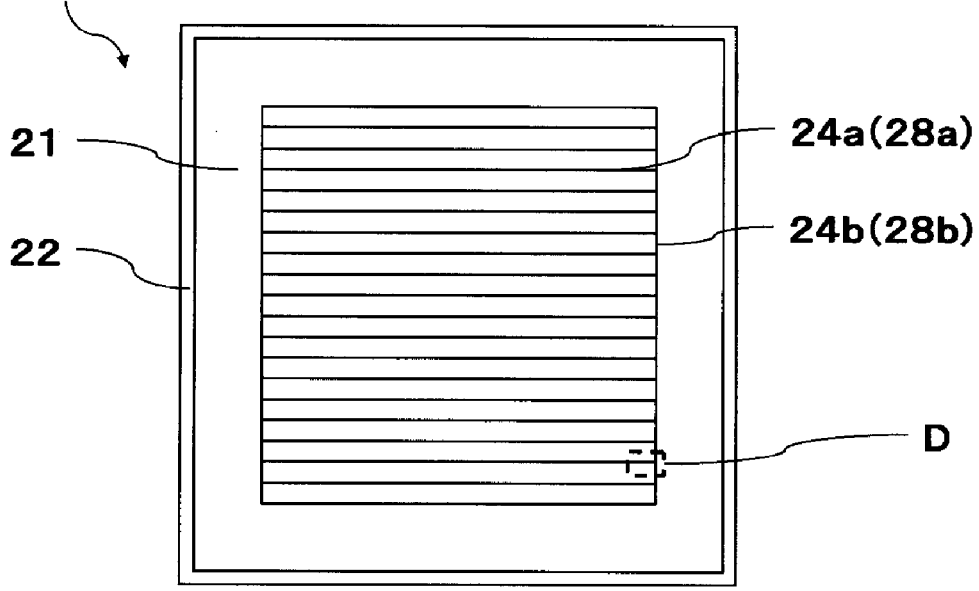
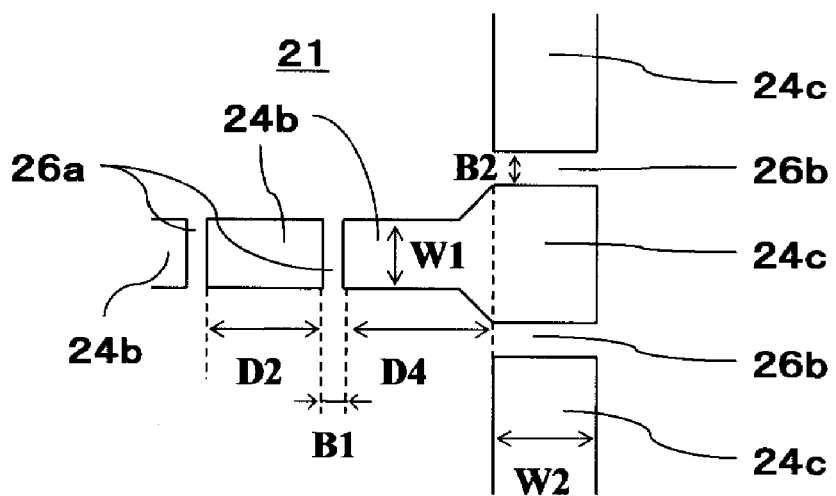

FIG. 10
(a)
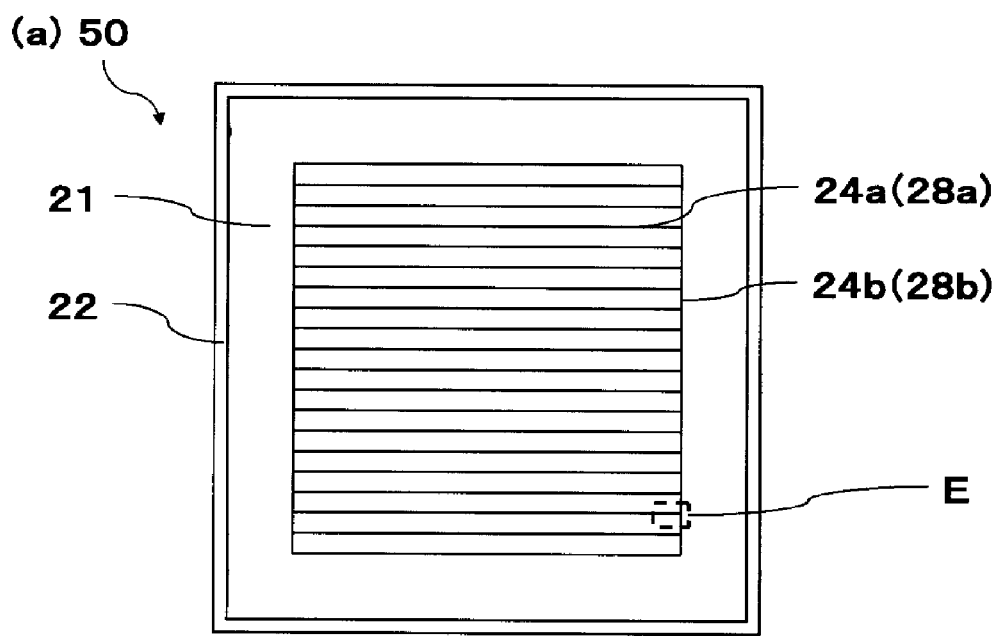
(b)
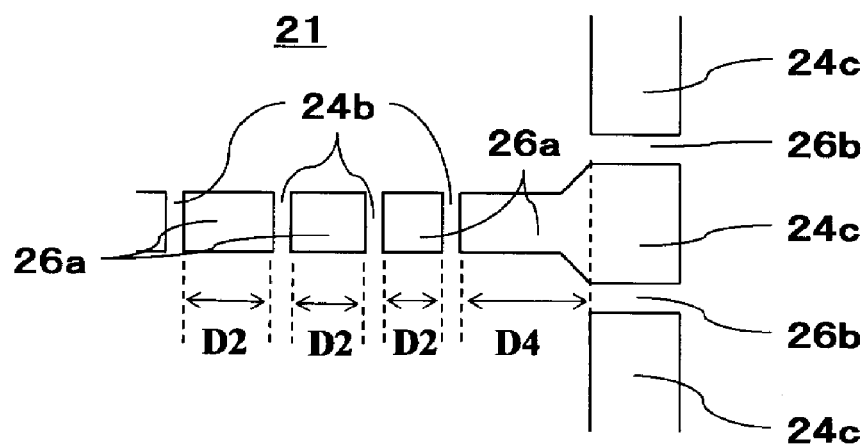

PRINTING PLATE AND METHOD FOR MANUFACTURING SOLAR CELL ELEMENT USING THE PRINTING PLATE

TECHNICAL FIELD

The present invention relates to a printing plate and to a method for manufacturing a solar cell element using the printing plate.

BACKGROUND ART

In a solar cell element employing semiconductor substrate made of silicon or the like, electrodes provided at a light-receiving-surface side thereof include a plurality of linearly shaped current-collecting electrodes and an output-extracting electrode which intersects the current-collecting electrodes. To increase the amount of light received by the solar cell element, electrodes at the light-receiving-surface side are formed so as to have narrow linewidth. Such electrodes may be formed by means of screen printing by applying electrically conductive paste in a prescribed configuration and subjecting this to heat treatment. Japanese Patent Application Publication Kokai No. 2005-111788 discloses, as a printing plate which may be used in screen printing, a printing plate equipped with a metal plate, a through-hole through which electrically conductive paste can pass, and an emulsion provided on one surface of the metal plate and an inner surface of the through-hole.

However, if the foregoing printing plate is used to carry out printing over multiple iterations, because electrically conductive paste supplied to the through-hole makes the emulsion tend to delaminate and reduces the endurance of the printing plate, the possibility has existed that productivity could be reduced.

SUMMARY OF INVENTION

It is an object of the present invention to provide a printing plate and a method for manufacturing a solar cell element using the printing plate that permits improvements in productivity.

A printing plate according to an embodiment of the present invention includes a metal plate, a buffer layer arranged on a principal plane of the metal plate, and a slit that penetrates the metal plate and the buffer layer. The slit includes a first penetration portion disposed in the metal plate, a second penetration portion disposed in the buffer layer, and a bridge that straddles an interior of the first penetration portion. When viewed as a planar view from the principal-plane side, a rim of an opening at the buffer-layer side of the first penetration portion is inwardly disposed relative to a rim of an opening at the metal-plate side of the second penetration portion.

A method for manufacturing a solar cell element according to an embodiment of the present invention includes a printing operation in which the foregoing printing plate is used to print electrically conductive paste that will become a plurality of linearly shaped current-collecting electrodes onto one principal plane of a semiconductor substrate.

Because the foregoing printing plate and method for manufacturing a solar cell element permit reduction in delamination of the buffer material at the printing plate, it is possible to improve productivity.

BRIEF DESCRIPTION OF THE DRAWINGS

FIG. 9(a) is a plan view showing a printing plate associated with a third embodiment of the present invention; FIG. 9(b) is an enlarged plan view of region D at FIG. 9(a).

FIG. 10(a) is a plan view showing a printing plate associated with a fourth embodiment of the present invention; FIG. 10(b) is an enlarged plan view of region E at FIG. 10(a).

EMBODIMENTS FOR CARRYING OUT THE INVENTION

Below, embodiments of the present invention are described in detail with reference to the attached drawings.

Solar Cell Element

Examples of solar cell elements which may be manufactured using printing plates associated with embodiments of the present invention will first be described.

<First Solar Cell Element>

Figure 1:
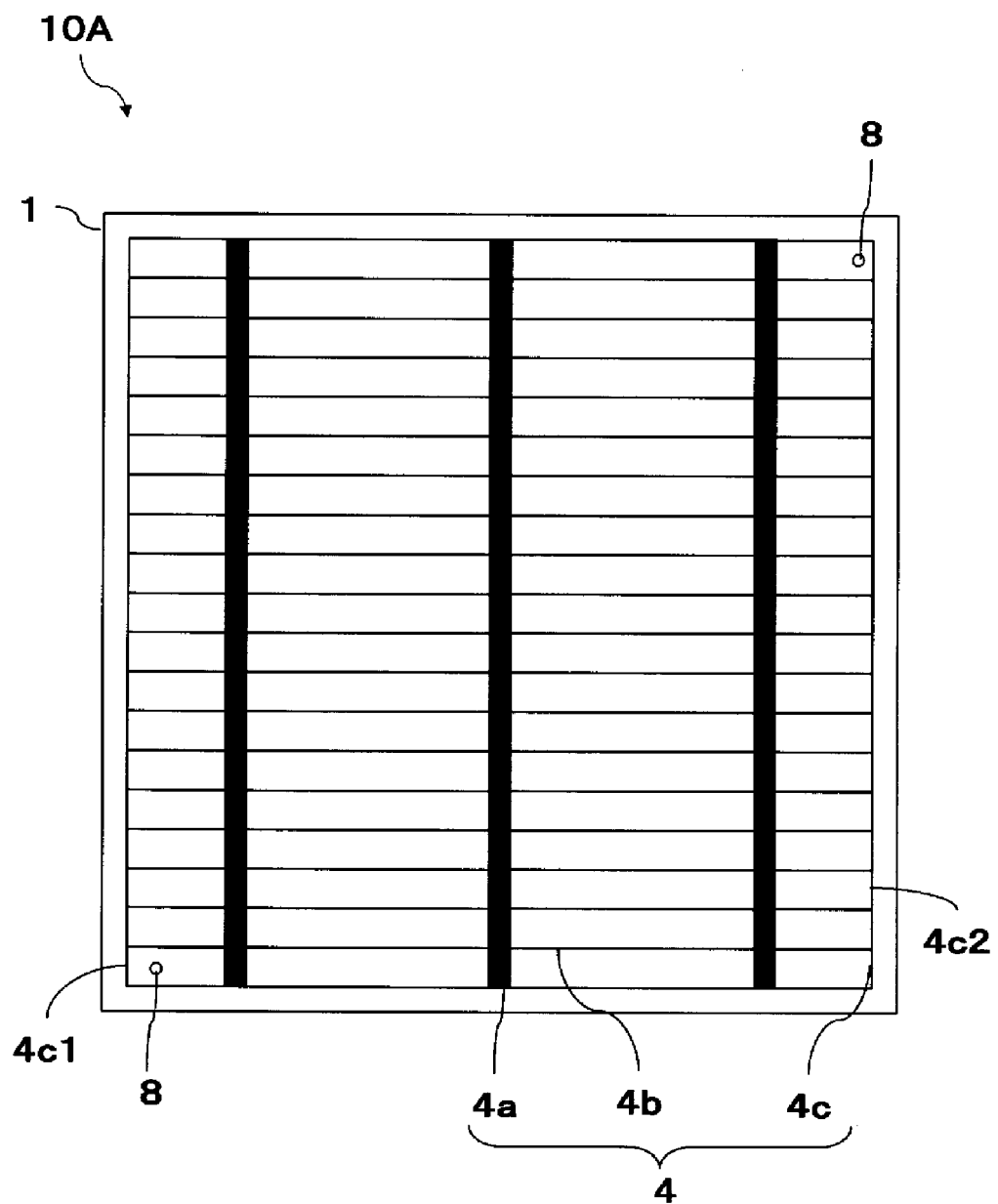
FIG. 1 is a pan view of an embodiment of a first solar cell element which may be manufactured using a printing plate associated with an embodiment of the present invention as viewed from a first-surface side.
Figure 2:
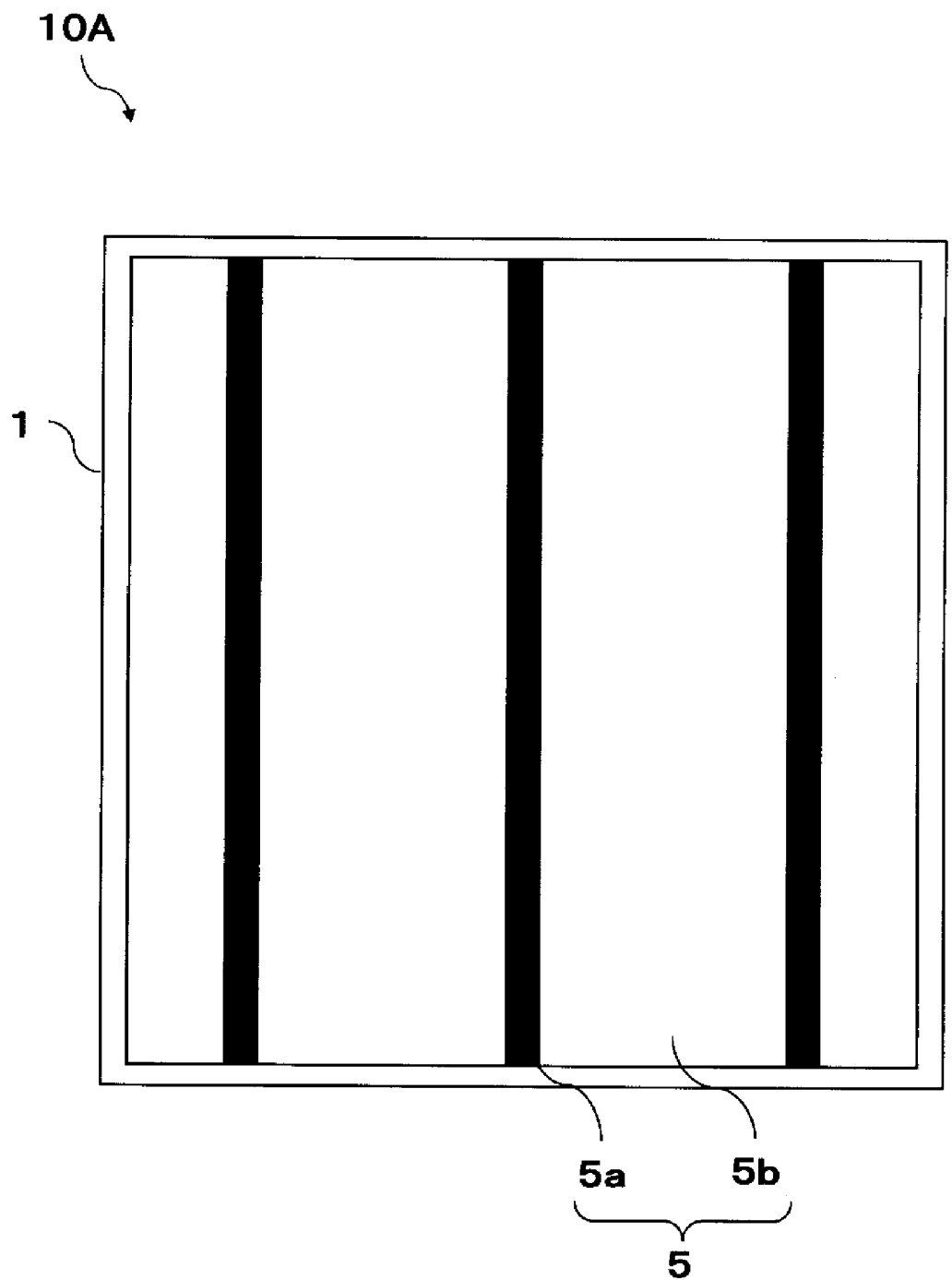
FIG. 2 is a plan view of the first solar cell element shown in FIG. 1 as viewed from a second-surface side.
Figure 3:
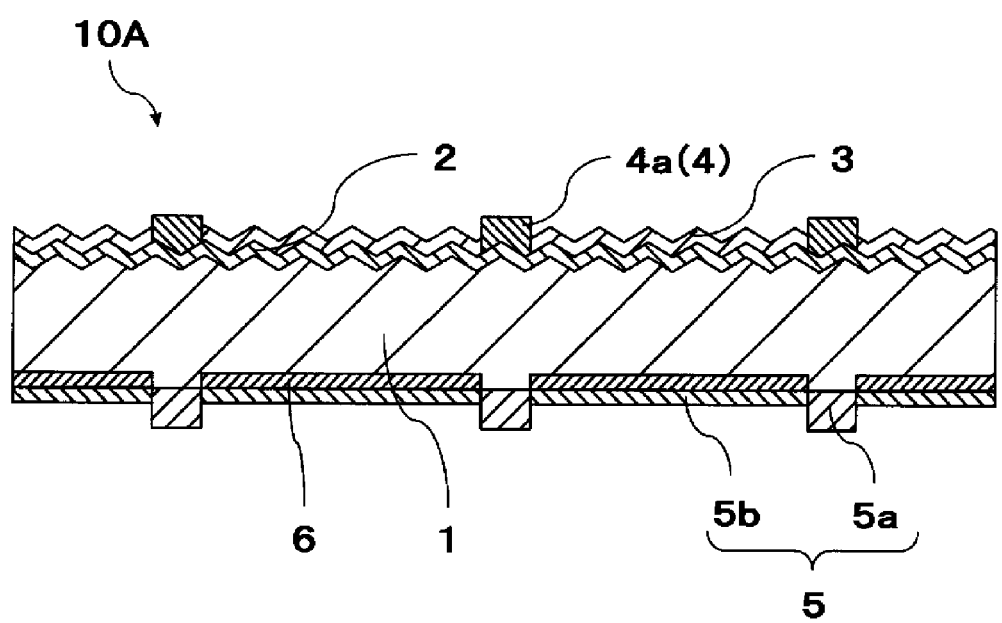
FIG. 3 is a sectional schematic view of the first solar cell element shown in FIG. 1.

As shown in FIG. 1 through FIG. 3, first solar cell element 10A is provided with semiconductor substrate 1; reverse-conductivity-type layer 2; and antireflective layer 3. Semiconductor substrate 1 includes a light-receiving surface (corresponding to the top surface in FIG. 3; hereinafter "first surface") on which light is incident, and a non-light-receiving surface (corresponding to the bottom surface in FIG. 3; hereinafter "second surface") which corresponds to the back surface of said first surface. Reverse-conductivity-type layer 2 is provided at a surface layer at the first-surface side of semiconductor substrate 1, and antireflective layer 3 is provided on the first surface (on reverse-conductivity-type layer 2 in the present embodiment) of semiconductor substrate 1. First solar cell element 10A includes first electrode 4 provided on the first surface of semiconductor substrate 1, and second electrode 5 provided on the second surface of semiconductor substrate 1.

As semiconductor substrate 1, a crystalline silicon substrate, such as a monocrystalline silicon substrate and a polycrystalline silicon substrate, including prescribed dopant element(s) (impurities for controlling conductivity type) and being of one conductivity type (e.g., p-type) may be employed. Thickness of semiconductor substrate 1 may, for example, be not more than 250 µm, or may be not more than 150 µm. While there is no particular limitation with respect to shape of semiconductor substrate 1, a rectangular shape therefor as in the present embodiment is favorable from the standpoint of manufacturability. As semiconductor substrate 1, a configuration may be employed in which an amorphous silicon layer, a chalcopyrite-type-compound semiconductor layer such as CIGS, and/or a CdTe layer are laminated on support substrate.

Reverse-conductivity-type layer 2, which is a layer having conductivity of opposite type to semiconductor substrate 1, is formed within a surface layer at the first surface of semiconductor substrate 1. For example, when p-type silicon substrate is used as semiconductor substrate 1, reverse-conductivity-type layer 2 will be formed from an n-type layer.

Antireflective layer 3 has the function of reducing reflectance of light within a desired wavelength and increasing the amount of photogenerated carriers. Provision of this antireflective layer 3 permits improvement in photocurrent density Jsc of the solar cell element. As antireflective layer 3, silicon nitride film, titanium oxide film, silicon oxide film, magnesium oxide film, indium tin oxide film, tin oxide film, zinc oxide film, and the like may be cited, for example. Thickness of antireflective layer 3 is suitably chosen depending on material, being set to a value such as will permit achievement of reduction in reflection of incident light as appropriate.

BSF region 6, which has the function of reducing decrease in efficiency of electric power generation due to carrier recombination occurring near the second surface of semiconductor substrate 1, causes formation of an internal electric field at the second-surface side of semiconductor substrate 1. BSF region 6 is of the same conductivity type as semiconductor substrate 1, and concentration of dopant present at BSF region 6 is higher than concentration of dopant present at semiconductor substrate 1. That is, dopant element(s) is/are present in higher concentration within BSF region 6 than the concentration of dopant element(s) with which semiconductor substrate 1 is doped for the purpose of making it one conductivity type. For example, when semiconductor substrate 1 is p-type, BSF region 6 may be formed by diffusing boron, aluminum, or other such dopant element(s) at the second surface so as to achieve a concentration of such dopant element(s) that is on the order of $1 \times 10^{18}$ to $5 \times 10^{21}$ atoms/cm$^3$. BSF region 6 is formed at a surface layer portion at the second-surface side of semiconductor substrate 1.

As shown in FIG. 1, first electrode 4 includes first output-extracting electrode 4a, plurality of linearly shaped first current-collecting electrodes 4b, and linearly shaped auxiliary electrode 4c. At least a portion of first output-extracting electrode 4a intersects first current-collecting electrode(s) 4b. Auxiliary electrode 4c intersects first current-collecting electrode(s) 4b at both end portions of semiconductor substrate 1. In the present embodiment, auxiliary electrode 4c is provided to interconnect end portions at one end of first current-collecting electrodes 4b and to interconnect end portions at the other end thereof. Alternatively, auxiliary electrode 4c may interconnect end portions at at least one end or the other of first current-collecting electrodes 4b. First output-extracting electrode 4a may, for example, have width on the order of 1.3 to 2.5 mm, and two or more first output-extracting electrodes 4a may be provided. On the other hand, first current-collecting electrode 4b and auxiliary electrode 4c, which are linear in shape and which may have widths on the order of 40 to 150 µm, may have widths that are smaller than the width of first output-extracting electrode 4a. In addition, a plurality of first current-collecting electrodes 4b are provided in such fashion as to be spaced apart with on the order of 1 to 3 mm therebetween. Such first electrode 4 may comprise a metal such as silver and copper, thickness of which may be on the order of 10 to 40 µm.

As shown in FIG. 2, second electrode 5 includes second output-extracting electrode 5a and second current-collecting electrode 5b. Second output-extracting electrode 5a may have thickness on the order of 10 to 30 µm, and may have width on the order of 1.3 to 7 mm. Second output-extracting electrode 5a may be formed from similar material(s) and by similar method(s) of manufacture as the aforementioned first electrode 4. Second current-collecting electrode 5b may comprise a metal such as aluminum, and may have thickness on the order of 15 to 50 µm. Second current-collecting electrode 5b is formed approximately everywhere on the second surface of semiconductor substrate 1 except for part of second output-extracting electrode 5a. Second electrode 5 is not limited to the foregoing configuration, it being possible, for example, to employ an electrode configuration therefor which is similar to that of first electrode 4.

<Second Solar Cell Element>

Figure 4:
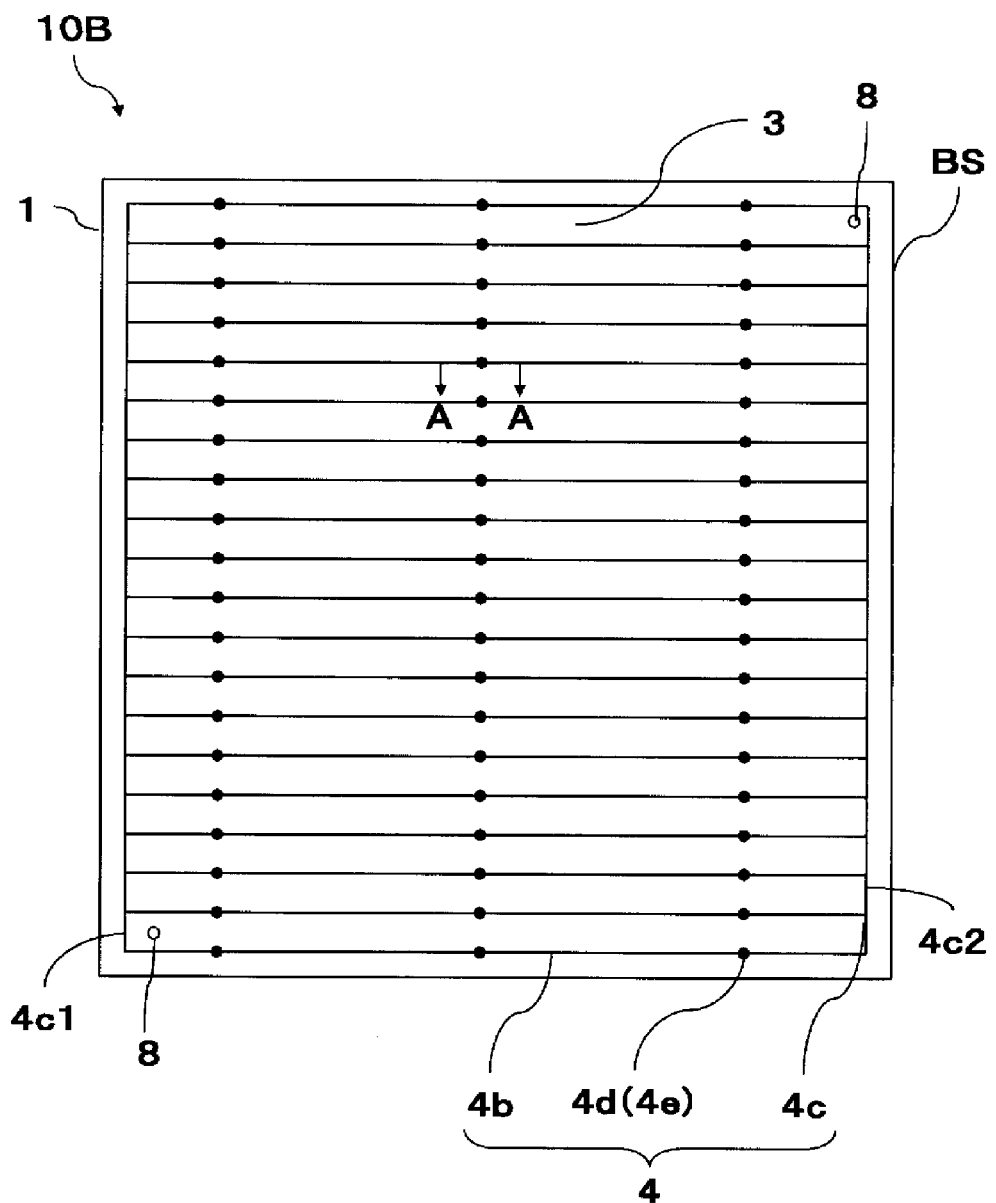
FIG. 4 is a plan view of a second solar cell element which may be manufactured using a printing plate associated with an embodiment of the present invention as viewed from a first-surface side.
Figure 5:
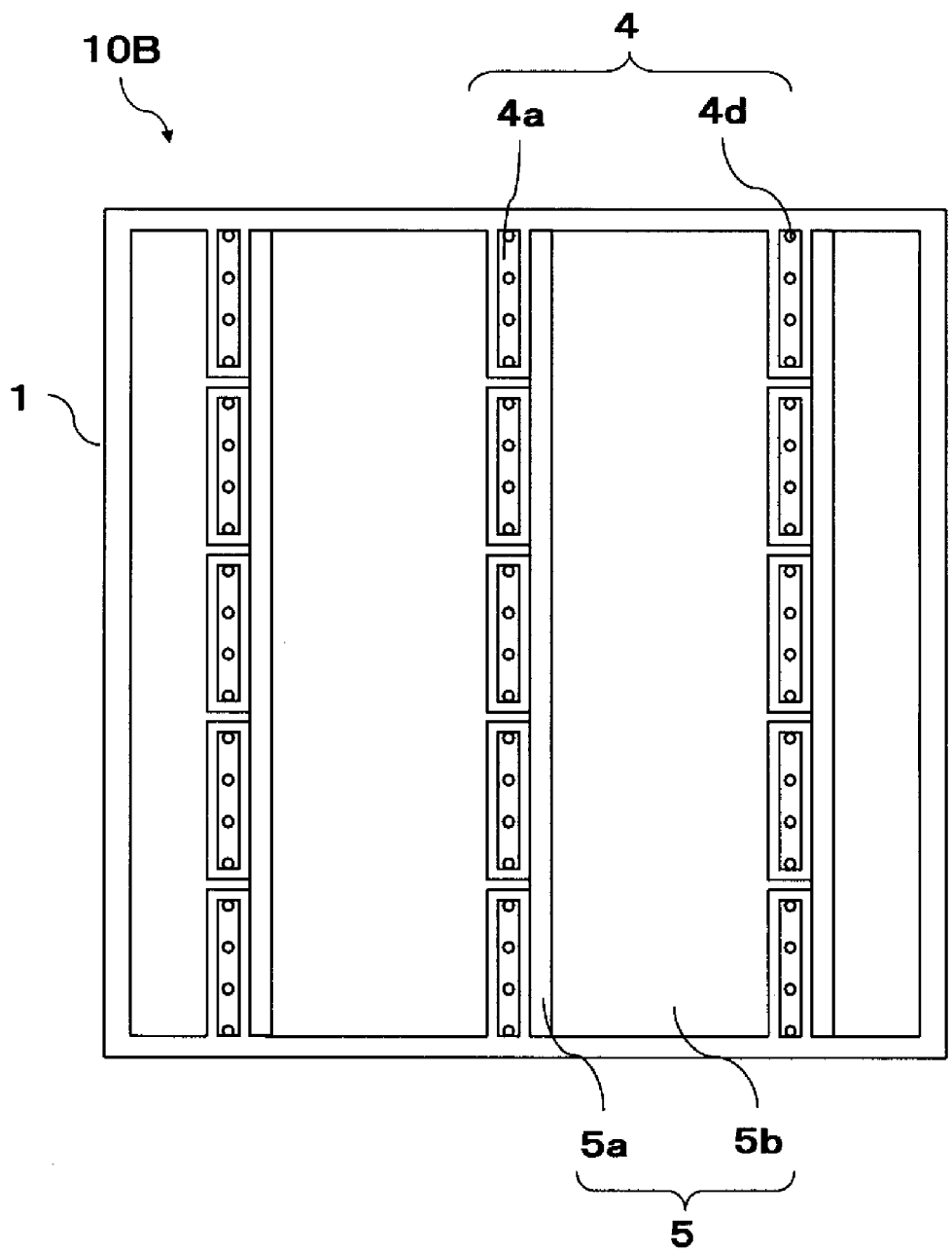
FIG. 5 is a plan view of the second solar cell element shown in FIG. 4 as viewed from the second-surface side.
Figure 6:
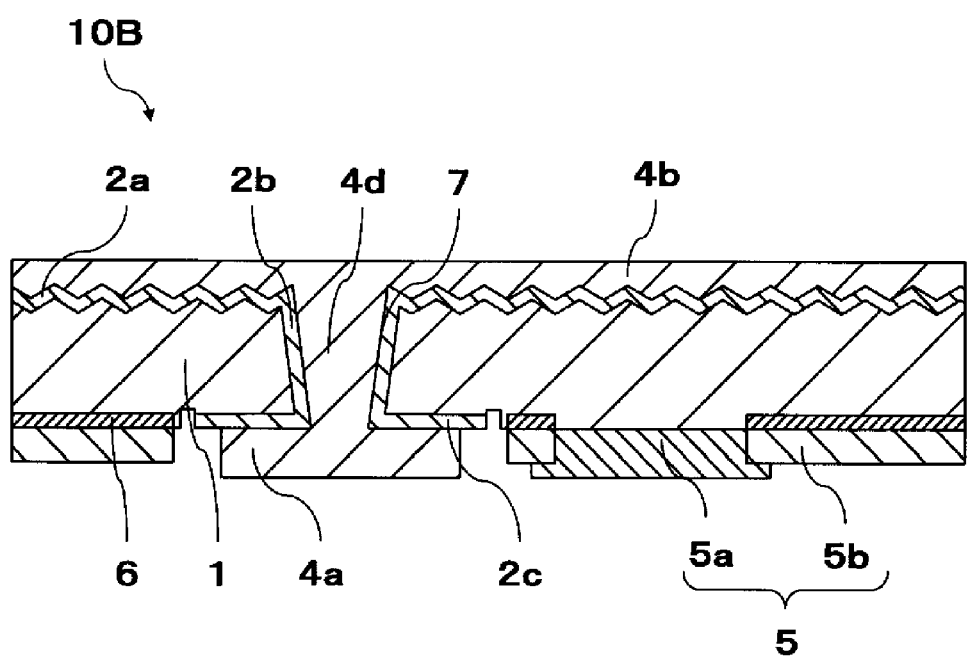
FIG. 6 is a sectional schematic view of section A-A at FIG. 4.

Structure of another solar cell element will now be described. As shown in FIG. 4 through FIG. 6, second solar cell element 10B includes semiconductor substrate 1; reverse-conductivity-type layer 2; antireflective layer 3; first electrode 4; and second electrode 5.

Differences from first solar cell element 10A are described below. In second solar cell element 10B is provided, first output-extracting electrode 4a is provided on the second surface thereof. Semiconductor substrate 1 includes plurality of through-holes 7 passing therethrough from the first surface to the second surface. First electrode 4 also includes conduction electrodes 4d which are provided within through-holes 7, these conduction electrodes 4d causing first output-extracting electrode(s) 4a and first current-collecting electrode(s) 4b to be electrically connected.

Reverse-conductivity-type layer 2 includes first reverse-conductivity-type layer 2a, which is formed at the first-surface side of semiconductor substrate 1; second reverse-conductivity-type layer 2b, which is formed at internal surface(s) of through-hole(s) 7; and third reverse-conductivity-type layer 2c, which is formed at the second-surface side of semiconductor substrate 1. First output-extracting electrode 4a is formed on the third reverse-conductivity-type layer 2c. Insulator layer(s) may be provided on the second surface and on internal surface(s) of through-hole(s) 7, and the first electrode 4 may be provided on the insulator layer(s).

Plurality of conduction electrodes 4d are arrayed in a prescribed direction. More specifically, as shown in FIG. 4, in this second solar cell element 10B, a plurality of conduction electrodes 4d are arrayed in a plurality of columns (three columns at FIG. 4) disposed in a direction parallel to a reference side BS at the first surface of semiconductor substrate 1. Here, reference side BS is an side which is parallel to a direction in which second solar cell elements 10B are arrayed when a plurality of second solar cell elements 10B are arrayed to form a solar cell module. It should be understood that the term "parallel" as used in the present specification should not be interpreted in a strictly mathematical or other such sense.

First current-collecting electrode(s) 4b interconnect conduction electrodes 4d belonging to mutually different columns. For example, at second solar cell element 10B shown in FIG. 4, first current-collecting electrode 4b is arranged so as to connect three conduction electrodes 4d disposed in a direction perpendicular to the direction in which conduction electrodes 4d are arrayed.

As shown in FIG. 4, first electrode 4 may include circular pad electrode(s) 4e provided at the first surface side so as to cover through-hole(s) 7. Diameter of pad electrode 4e is greater than diameter of through-hole 7 when viewed as a planar view from the first-surface side. In such an embodiment, it will still be possible to make connection with conduction electrode(s) 4d even if the location at which first current-collecting electrode 4b is formed is slightly misaligned, increasing reliability.

<Printing Plate>

A printing plate associated with an embodiment of the present invention will now be described.

First Embodiment

Using FIG. 7(a) through FIG. 7(c), printing plate 20 associated with a first embodiment will be described in detail.

Figure 7:
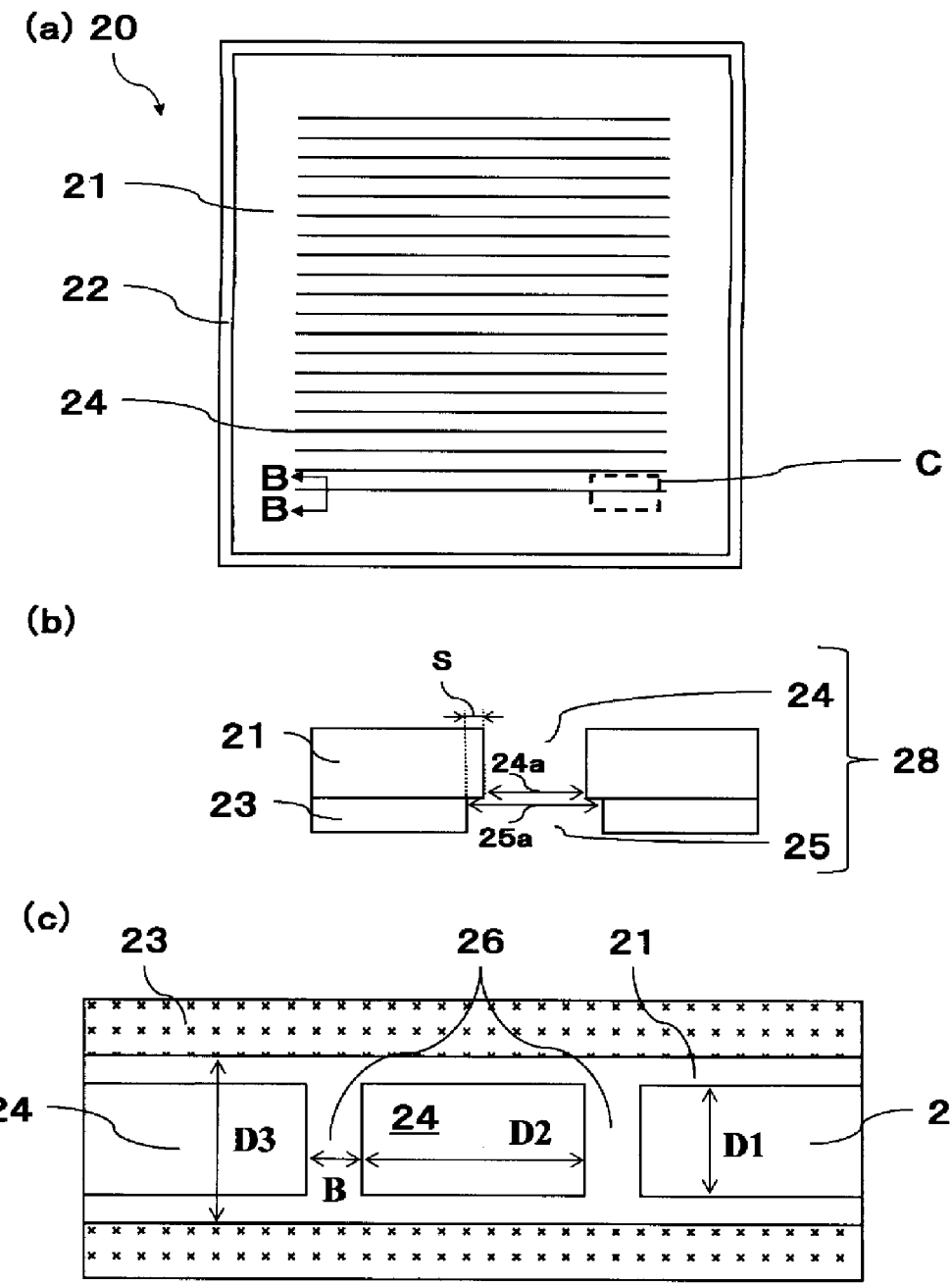
FIG. 7(a) is a plan view showing a printing plate associated with a first embodiment of the present invention.
FIG. 7(b) is a sectional schematic view of section B-B at FIG. 7(a); FIG. (c) is an enlarged plan view of region C at FIG. (a) as seen from the buffer-layer side.

As shown at FIGS. 7(a) and (b), printing plate 20 includes metal plate 21, buffer layer 23, and slit 28. Printing plate 20 may also include frame 22 which supports the periphery of metal plate 21. Presence of frame 22 permits improvement in strength of printing plate 20, making it possible to extend the lifetime of printing plate 20.

Buffer layer 23 is arranged at one principal plane of metal plate 21. More specifically, buffer layer 23 is provided at the surface (one principal plane of semiconductor substrate 1) of metal plate 21 which faces semiconductor substrate 1.

Slit 28 penetrates metal plate 21 and buffer layer 23. Electrically conductive paste which will become electrode(s) passes through this slit 28. Slit 28 includes first penetration portion 24 located in metal plate 21, and second penetration portion 25 provided in buffer layer 23. For this reason, electrically conductive paste passes through first penetration portion 24 and second penetration portion 25 as it is printed on one principal plane of semiconductor substrate 1.

When viewed as a planar view from the one principal-plane side of metal plate 21, printing plate 20 is such that the rim 24a of the opening at the buffer-layer 23 side of first penetration portion 24 is inwardly disposed relative to the rim 25a of the opening at the metal-plate 21 side of second penetration portion 25. This being the case, when viewed as a planar view from the one principal-plane side of metal plate 21, buffer layer 23 is outwardly disposed relative to first penetration portion 24. As a result, at printing plate 20, stresses are less likely to act on buffer layer 23 when a squeegee or the like is for example used to cause electrically conductive paste to flow in order into first penetration portion 24 and second penetration portion 25. This makes it possible to reduce delamination of buffer layer 23.

At printing plate 20, because the positional relationship between the rim 24a of the opening at first penetration portion 24 and the rim 25a of the opening at second penetration portion 25 satisfies the foregoing relationship, buffer layer 23 is not provided in the vicinity of the rim 24a of the opening at first penetration portion 24. For this reason, when electrically conductive paste is supplied to slit 28 and is pressed on by a squeegee to cause it to be transferred to the one principal plane of semiconductor substrate 1, the rim 24a of the opening at first penetration portion 24 tends to broaden outwardly, which tends to facilitate emergence of electrically conductive paste therefrom.

A plate which is 20 to 50 μm in thickness and which is made of nickel, stainless steel, or the like may, for example, be used as metal plate 21. First penetration portion 24 may be formed by using a laser or the like, for example, to perforate metal plate 21. First penetration portion 24 may be formed when the metal plate 21 is formed by an additive process (electroforming).

As shown at FIG. 7(c), in the present embodiment, printing plate 20 includes bridge(s) 26 that straddle the interior of first penetration portion 24. Adoption of such an embodiment makes it possible to use bridge(s) 26 to increase strength of printing plate 20, and to reduce breakage of printing plate 20 that would otherwise occur when printing is repeated over multiple iterations.

At printing plate 20 associated with the present embodiment, reduction in delamination of buffer layer 23 and increase in strength of slit 28 are made possible as described above. This makes it possible to improve endurance of printing plate 20 and to extend the life of printing plate 20.

Such a printing plate 20 may be favorably used to print patterns for electrodes that are narrow in width and long in one direction such as is the case with first current-collecting electrode 4b.

At this time, bridge 26 is exposed to the exterior when viewed as a planar view from the one principal-plane side. That is, buffer layer 23 may not be provided at the surface of bridge 26 at the one principal plane side. Adoption of such an embodiment makes it possible to cause electrically conductive paste which has passed through first penetration portion 24 to more readily surround the lower portion of bridge 26, making it possible to reduce occurrence of printing defects such as electrical opens. As shown at FIG. 7(c), where first penetration portion 24 is linear in shape, bridge(s) 26 may be provided so as to straddle first penetration portion 24 in a direction perpendicular to the longitudinal direction of the first penetration portion 24, and may be provided so as to be cruciform in shape when viewed as a planar view from the metal-plate 21 side of printing plate 20.

When dimension D1 (hereinafter sometimes referred to as "width D1 of first penetration portion 24") of first penetration portion 24, which corresponds to the width direction of the linearly shaped electrode being printed, is, for example, made to be on the order of 30 to 80 μm, first penetration portion 24 may be formed such that dimension D2 of first penetration portion 24, which corresponds to the longitudinal direction of the linearly shaped electrode and which is surrounded by adjacent bridge(s) 26, be on the order of 50 to 150 μm. Width B of bridge 26 may be smaller than dimension D1 of first penetration portion 24; for example, this may be on the order of 25 to 60 μm. According to such an embodiment, it is possible to reduce occurrence of electrically conductive paste seepage, electrical opens, and other such printing defects. If thickness of metal plate 21 is taken to be "t", the relationship width $B(\mu m) > (0.0038 \times t(\mu m) + 0.29) \times$ dimension $D2(\mu m) + 13.5$ and the relationship width $B(\mu m) < (1.09 \times t(\mu m)^{-0.409}) \times$ dimension $D2(\mu m) + 27$ may be satisfied. In such case, it will be possible to reduce breakage and so forth of printing plate 20 that would otherwise occur when printing is repeated over multiple iterations, it will be possible to extend the life of printing plate 20, and it will be possible to reduce electrical opens that would occur due to printing defects.

Width B and dimension D1 as used herein each refer to the respective dimension as seen from the one principal-plane side.

In the present embodiment, forming the width of rim 24a of the opening at the buffer-layer 23 side of first penetration portion 24 so as to be larger than the width of the opening on the side of first penetration portion 24 at which electrically conductive paste is supplied will make it possible to efficiently direct electrically conductive paste to second penetration portion 25.

Frame 22, which is arranged along the outside periphery of metal plate 21, has a role of protecting metal plate 21. Tensile stresses acting on metal plate 21 may be adjusted when attaching frame 22 to metal plate 21 by causing metal plate 21 to be supported as tensile stresses are applied to metal plate 21. This will make it possible to adjust misalignment of dimensions at metal plate 21.

Buffer layer 23 is arranged at the one principal-plane side of metal plate 21. That is, at printing plate 20, buffer layer 23 is arranged so as to come in contact with the one principal-plane side of semiconductor substrate 1 which will receive the printed pattern. As such buffer layer 23, an emulsion layer may, for example, be employed. Such an emulsion layer may, for example, be formed as follows. First, at metal plate 21, photosensitive resin is applied to the surface thereof which faces one principal plane of semiconductor substrate 1, and this is exposed by way of a mask of desired configuration, causing the photosensitive resin to cure. Unwanted uncured photosensitive resin is thereafter removed to form an emulsion layer of desired configuration. As such photosensitive resin, diazo-type, stilbazolium-type (SBQ-type), or acrylic-type resin(s) may, for example, be employed.

As has been described, when viewed as a planar view from the one principal-plane side of metal plate 21, in the printing plate 20, the rim 24a of the opening at the buffer-layer 23 side of first penetration portion 24 is inwardly disposed relative to the rim 25a of the opening at the metal-plate 21 side of second penetration portion 25. That is, as shown at FIG. 7(b), buffer layer 23 is formed such that second penetration portion 25 is outwardly disposed relative to, being separated by spacing S from, the inside circumference of first penetration portion 24. Therefore, width D3 of the opening at second penetration portion 25 is larger than width D1 of the opening at first penetration portion 24. At this time, width D3 of second penetration portion 25 may, for example, be on the order of 1 to 20 μm wider than width D1 of first penetration portion 24.

Thickness of buffer layer 23 may be on the order of 1 to 40 μm, it being possible to adjust the amount of photosensitive resin which is applied so as to attain such thickness. Width D3 of the opening at second penetration portion 25 may be constant or may increase/decrease in the thickness direction of buffer layer 23. When width D3 of the opening at second penetration portion 25 is larger than width D1 of the opening at first penetration portion 24, it will be possible to readily direct electrically conductive paste toward the one principal plane side of semiconductor substrate 1. In particular, when the width of second penetration portion 25 in the thickness direction is increase/decrease so as to cause second penetration portion 25 to be formed with tapered configuration, the width of second penetration portion 25 may be made larger toward the one principal-plane side of semiconductor substrate 1.

Width B of bridge 26 may increase/decrease in the thickness direction, it being possible for width B of bridge 26 to be smaller toward the one principal-plane side of metal plate 21. Adoption of such an embodiment makes it possible to cause electrically conductive paste which has passed through first penetration portion 24 to more readily surround the lower portion of bridge 26, making it possible to reduce occurrence of printing defects such as electrical opens.

In the present embodiment, the dimension in the thickness direction of bridge 26 is more or less the same as the dimension in the thickness direction of metal plate 21. This will make it possible to achieve improved strength at printing plate 20 and will cause electrically conductive paste to exit more smoothly. The dimension in the thickness direction of bridge 26 is not limited hereto. For example, the dimension in the thickness direction of bridge 26 may be selected as appropriate in correspondence to the configuration of the pattern employed for bridge 26 as well as the material and thickness of metal plate 21.

Second Embodiment

Using FIG. 8, a printing plate 30 associated with a second embodiment will now be described in detail. Description will be omitted where constitution is similar to that of printing plate 20 associated with the first embodiment.

Figure 8:
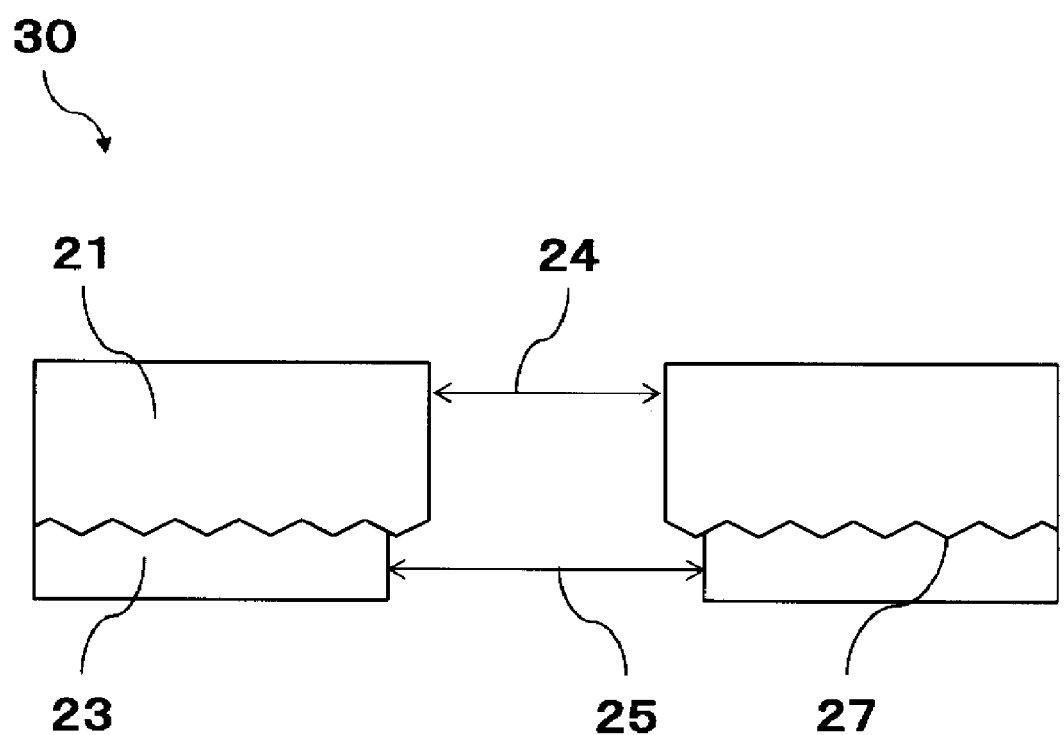
FIG. 8 is a partial sectional schematic view showing a printing plate associated with a second embodiment of the present invention.

As shown in FIG. 8, printing plate 30 includes surface irregularity 27 on a surface of metal plate 21 at the one principal-plane side of semiconductor substrate 1. Provision of such surface irregularity 27 and roughening of the surface of metal plate 21 make it possible to improve strength of the bond between metal plate 21 and buffer layer 23. The foregoing surface roughening may be carried out by grinding using abrasive grains having a comparatively large grain size. Alternatively, treatments such as chemical etching may be carried out so as to obtain an arithmetic mean roughness Ra (JIS B0601-2001) on the order of 0.01 to 3 μm. Here, as comparatively large abrasive grain size, abrasive grains having particle diameter on the order of 5 to 40 μm may be employed.

Third Embodiment

Using FIG. 9, a printing plate 40 associated with a third embodiment will now be described in detail. Description will be omitted where constitution is similar to that of printing plate 20 associated with the first embodiment.

Printing plate 40 associated with the third embodiment differs from printing plate 20 associated with the first embodiment with respect to the configuration of slit 28.

More specifically, as shown at FIG. 9(a), slit 28 of printing plate 40 includes one or more first slits 28a and second slit 28b as a result of a configuration in a pattern corresponding to the configuration of one or more first current-collecting electrodes 4b and one or more auxiliary electrodes 4c. First slits 28a are such that end portions at one end and end portions at the other end are arrayed together. Second slit 28b is connected to at least either the end portions at one end or the end portions at the other end of adjacent first slits 28a. First slit 28a and second slit 28b respectively include first penetration portion 24 and second penetration portion 25.

That is, first penetration portion 24 includes first region 24b which corresponds to first current-collecting electrode 4b, and second region 24c which corresponds to auxiliary electrode 4c. First region 24b is linear in shape, and second region 24c is connected to at least either the end portions at one end or the end portions at the other end of adjacent first regions 24b. In the present embodiment, auxiliary electrode 4c includes both a first auxiliary electrode 4c1 which interconnects end portions at one end of first current-collecting electrodes 4b, and a second auxiliary electrode 4c2 which interconnects end portions at the other end thereof. At printing plate 40, second region 24c, which corresponds to auxiliary electrode 4c, therefore includes a portion that interconnects end portions at one end of first regions 24b, and a portion that interconnects end portions at the other end of first regions 24b.

As shown at FIG. 9(b), in the printing plate 40, width W2 of the opening at the buffer-layer 23 side of second region 24c of first penetration portion 24 is larger than width W1 of the opening at the buffer-layer 23 side of first region 24b of first penetration portion 24. Employment of such printing plate 40 makes it possible to reduce occurrence of electrical opens at auxiliary electrode 4c even when electrically conductive paste has been applied by moving a squeegee in the longitudinal direction of first current-collecting electrode 4b. At this time, width W2 of the opening at the buffer-layer 23 side of second region 24c may, for example, be made larger than width W1 of the opening at the buffer-layer 23 side of first region 24b by 10 to 50 μm.

Here width W2 of the opening at the buffer-layer 23 side of second region 24c refers to the dimension in the width direction of second region 24c; that is, the dimension of second region 24c, which has elongated shape, in a direction perpendicular to the longitudinal direction thereof. Width W1 of the opening at the buffer-layer 23 side of first region 24b may be defined in similar fashion as width W2.

At printing plate 40, first region 24b and second region 24c of first penetration portion 24 are arranged so as to mutually intersect. As shown at FIG. 9 (b), in the printing plate 40, in the vicinity of the intersection of first region 24b and second region 24c, width W1 of the opening at the buffer-layer 23 side of first region 24b may be larger toward second region 24c. That is, first region 24b is of tapered configuration toward second region 24c. The foregoing intersection corresponds to a location at which connection between first current-collecting electrode 4b and auxiliary electrode 4c is formed. In the present embodiment, making the width of the opening of first penetration portion 24 at the foregoing intersection larger facilitates emergence of electrically conductive paste from first penetration portion 24 even when the first current-collecting electrode 4b and auxiliary electrode 4c being printed are extremely fine in width. As a result, it is possible to reduce occurrence of electrical opens due to printing defects.

Like printing plate 20, printing plate 40 includes bridge(s) 26. As shown at FIG. 9(b), bridge 26 at printing plate 40 includes first bridge portion 26a which straddles the interior of first region 24b of first penetration portion 24 in the width direction, and second bridge portion 26b which straddles the interior of second region 24c of first penetration portion 24 in the width direction. Width B2 of second bridge portion 26b is larger than width B1 of first bridge portion 26a. In electrode printing operations, electrically conductive paste may be applied by moving a squeegee in parallel fashion with respect to the longitudinal direction of first current-collecting electrode 4b from an auxiliary electrode 4c at one end toward an auxiliary electrode 4c at the other end. In such case, the pressure imparted by the squeegee to printing plate 40 will increase near where printing begins and near where printing finishes. As has been described, in the printing plate 40, width B2 of second bridge portion 26b is larger than width B1 of first bridge portion 26a. That is, in the printing plate 40, strength is high at second bridge portion 26b, which corresponds to formation of auxiliary electrode 4c, where pressure from the squeegee is comparatively large. For this reason, it is possible to reduce breakage or the like of printing plate 40 that would otherwise occur and to extend the life of printing plate 40, even when printing is repeated over multiple iterations by moving the squeegee as has been described. Width B2 of second bridge portion 26b may, for example, be on the order of 5 to 20 μm larger than width B1 of first bridge portion 26a.

In the present embodiment, shown was an example in which pluralities of first bridge portions 26a and second bridge portions 26b were provided, the number of first bridge portion(s) 26a and the number of second bridge portion(s) 26b present at bridge 26 are not limited hereto. For example, the number of first bridge portion(s) 26a and the number of second bridge portion(s) 26b which bridge 26 includes may be selected as appropriate in correspondence to the size of the pattern being printed, the strength of metal plate 21, and so forth.

Furthermore, in the present embodiment, distance D4 to second region 24c from the first bridge portion 26a which is closest to second region 24c is not less than distance D2 between adjacent first bridge portions 26a. Adoption of such a constitution makes it possible to facilitate emergence of electrically conductive paste from first penetration portion 24, making it possible to reduce occurrence of electrical opens due to printing defects, even at locations where first region 24b and second region 24c intersect, and even when first region 24b and second region 24c are extremely fine.

Fourth Embodiment

Using FIG. 10, a printing plate 50 associated with a fourth embodiment will now be described in detail. Description will be omitted where constitution is similar to that of printing plate 40 associated with the third embodiment.

As shown at FIG. 10(b), like printing plate 40, printing plate 50 includes bridge 26 which includes first bridge portion 26a and second bridge portion 26b. More specifically, in the present embodiment as well, bridge 26 includes plurality of first bridge portions 26a and plurality of second bridge portions 26b.

In the present embodiment, distance D2 between adjacent first bridge portions 26a grows smaller as one approaches second region 24c. Adoption of such a constitution makes it possible to improve strength of printing plate 50 at location(s) where pressure from the squeegee is comparatively large during printing operations as has been described. As a result, there is increase in the effect whereby breakage or the like of printing plate 50 that would otherwise occur is reduced and the life of printing plate 50 is extended.

At this time, the constitution, in which the distance D2 between adjacent first bridge portions 26a grows smaller as one approaches second region 24c, may refer to a constitution in which distance D2 grows progressively smaller as one approaches second region 24c, or a constitution that includes an interval over which distance D2 is constant.

In the present embodiment, moreover, distance D4 to second region 24c from the first bridge portion 26a which is closest to second region 24c may be not less than the minimum value of distance D2 between adjacent first bridge portions 26a. In particular, the aforementioned effect will be further heightened if this is not less than the maximum value of distance D2 between adjacent first bridge portions 26a.

Fifth Embodiment

Figure 11:
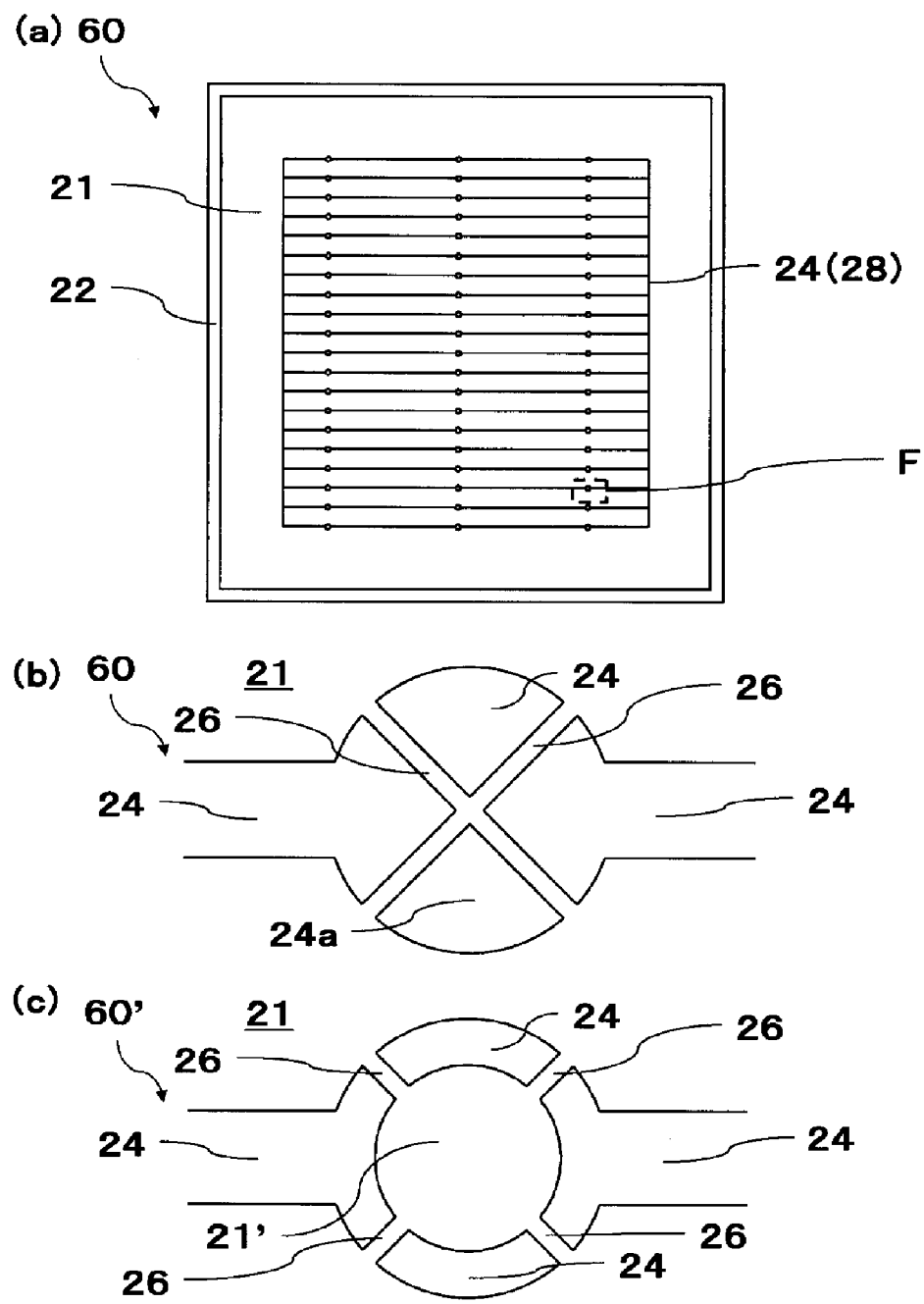
FIG. 11(a) is a plan view showing a printing plate associated with a fifth embodiment of the present invention.
FIG. 11(b) is an enlarged plan view of region F at FIG. 11(a)
FIG. 11(c) is a variation on region F shown at FIG. 11(b).

Using FIG. 11, a printing plate 60 associated with a fifth embodiment will now be described in detail. Description will be omitted where constitution is similar to that of printing plate 40 associated with the third embodiment.

The present embodiment differs from printing plate 40 of the third embodiment with respect to the configuration of slit 28. More specifically, printing plate 60 may be used during printing operations for forming electrodes at second solar cell element 10B. That is, as shown in FIG. 11, in printing plate 60, first penetration portion 24 includes, in the direction in which linearly shaped slit 28 extends, a linearly shaped portion which corresponds to first current-collecting electrode 4b, and a circular portion which corresponds to pad electrode 4e. As shown at FIG. 11(b), when forming conduction electrode 4d and pad electrode 4e, the circular portion of first penetration portion 24 includes a cruciform bridge 26 that straddles the interior of the circular portion. In other words, in the present embodiment, bridge 26 is formed in such fashion that an acute angle is formed between the direction in which the squeegee is moved and the longitudinal direction of bridge 26, bridge 26 being long in shape.

Adoption of such an embodiment makes it possible to reduce seepage at the paste layer which is formed, and, in addition, makes it possible to improve strength of bridge 26. The electrode pattern of second solar cell element 10B may thus be printed as described above. Employment of such printing plate 60 makes it possible to fill the interior of through-hole 7 with paste at pad electrode 4e, and makes it possible to provide an electrically conductive paste layer even at the interior of through-hole 7.

As shown at FIG. 11(c), a configuration in which circular metal plate 21' and buffer layer 23' are arranged at a portion where through-hole 7 is located in the circular portion of first penetration portion 24 may be cited as an example of a variation on the present embodiment. That is, slit 28 includes a donut-shaped portion connecting with collinear portion. Because FIG. 11(c) is a plan view as seen from the other principal-plane side of metal plate 21, it is apparent from FIG. 11(c) that first penetration portion 24 includes a linearly shaped portion and a donut-shaped portion. At this donut-shaped portion, bridge 26 is formed so as to be cruciform in shape.

Adoption of such an embodiment makes it possible to improve ability of electrically conductive paste to emerge therefrom and to reduce seepage of the electrically conductive paste layer that is formed. A solar cell element may thus be fabricated as described above. Employment of such printing plate 60' makes it possible to provide a donut-shaped electrically conductive paste layer which is present only at the periphery of through-hole 7, and to thus prevent the interior of through-hole 7 from being filled with paste at pad electrode 4e.

In the present embodiment, there is no objection to either arranging or not arranging buffer layer 23' on the surface of bridge 26 at the one principal-plane side. In an embodiment in which buffer layer 23' is not arranged on the surface of bridge 26 at the one principal-plane side, this will make it possible to cause electrically conductive paste which has passed through first penetration portion 24 to more readily surround the lower portion of bridge 26, making it possible to reduce occurrence of printing defects such as electrical opens.

Sixth Embodiment

Figure 12:
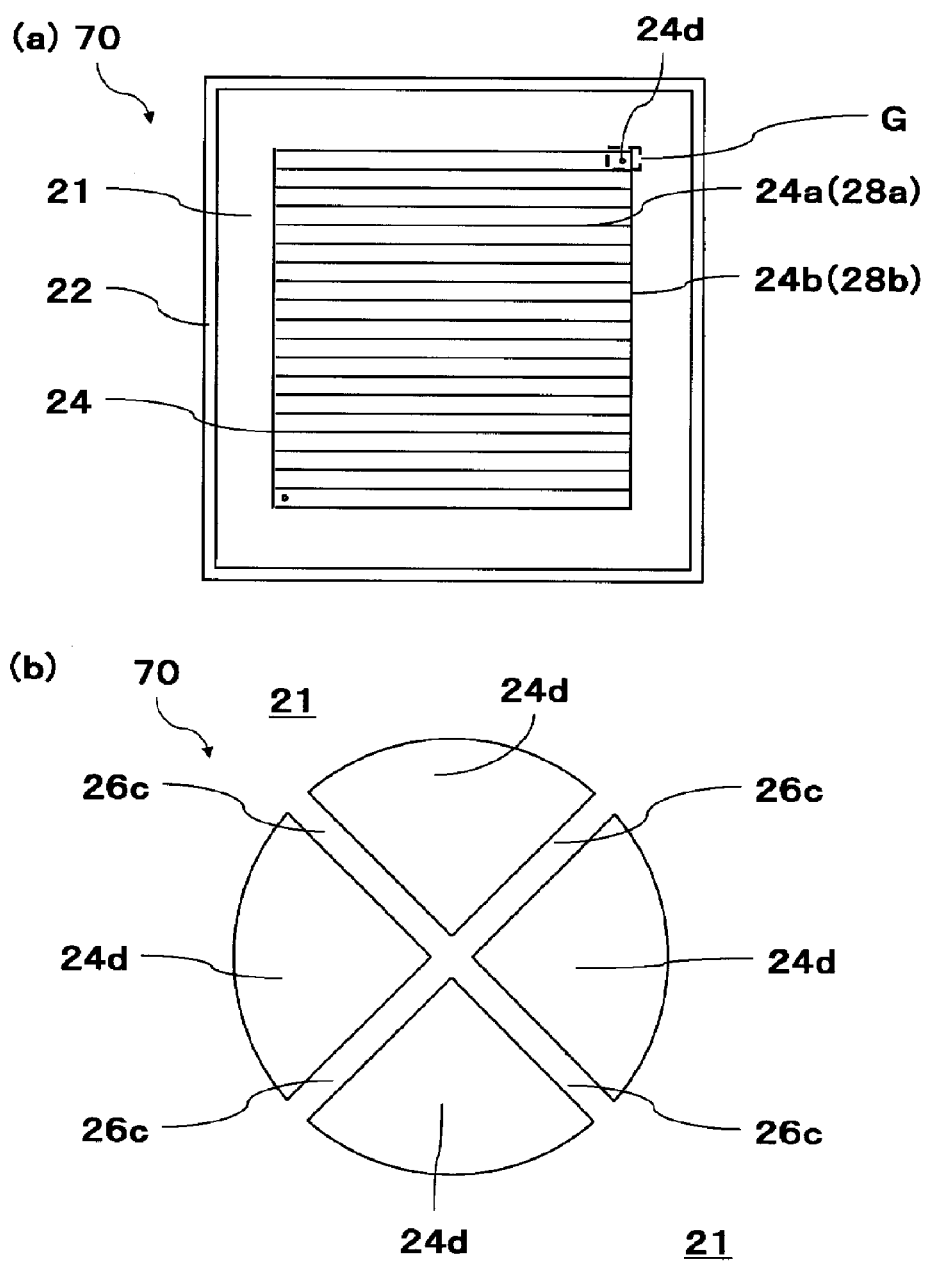
FIG. 12(a) is a plan view showing a printing plate associated with a sixth embodiment of the present invention.
FIG. 12(b) is an enlarged plan view of region G at FIG. 12(a).

Using FIG. 12, a printing plate 70 associated with a sixth embodiment will now be described in detail. Description will be omitted where constitution is similar to that of printing plate 40 associated with the third embodiment.

Printing plate 70 of the present embodiment may, for example, be used when carrying out printing of electrodes in layered fashion, or when providing one principal plane of semiconductor substrate 1 with alignment mark(s) 8 used for alignment of solar cell elements such as are shown in FIG. 1 or FIG. 4. More specifically, as shown at FIG. 12(a), first penetration portion 24 of printing plate 70 also includes third regions 24d respectively arranged near the first regions 24a that are at either end of the arrayed plurality of first regions 24a. In the present embodiment, as shown at FIG. 12(b), because alignment mark 8 is to be formed so as to be circular, third region 24d has a configuration in a pattern which is more or less identical to alignment mark 8. Slit 28 has cruciform third bridge portion 26c that straddles the interior of third region 24d. In other words, in the present embodiment, third bridge portion 26c is formed in such fashion that an acute angle is formed between the direction in which the squeegee is moved and the longitudinal direction of third bridge portion 26c, third bridge portion 26c being long in shape. Adoption of such an embodiment makes it possible to reduce seepage at the paste layer which is formed, and makes it possible to improve strength of third bridge portion 26c.

Seventh Embodiment

Using FIG. 13, a printing plate 80 associated with a seventh embodiment will now be described in detail. Description will be omitted where constitution is similar to that of printing plate 40 associated with the third embodiment.

Figure 13:
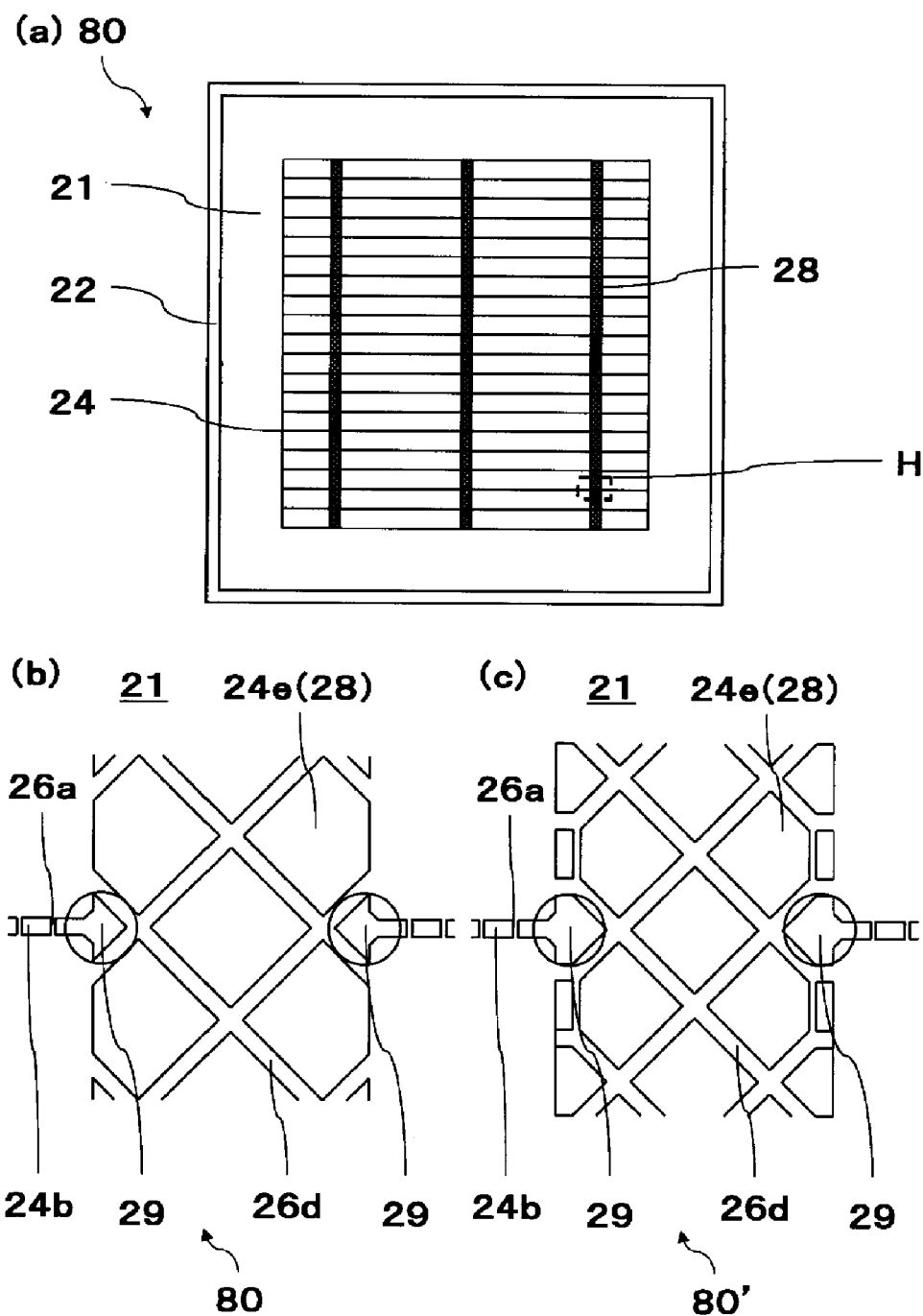
FIG. 13(a) is a plan view showing a printing plate associated with a seventh embodiment of the present invention.
FIG. 13(b) is an enlarged plan view of region H at FIG. 13(a)
FIG. 13(c) is a variation on region H shown at FIG. 13(b).

As shown at FIG. 13 (a), printing plate 80 associated with the present embodiment includes first penetration portion(s) 24 corresponding to first output-extracting electrode 4a, first current-collecting electrode 4b, and auxiliary electrode 4c at first solar cell element 10A. That is, first penetration portion 24 includes fourth region 24e for forming first output-extracting electrode 4a. As shown at FIG. 13(b), slit 28 also includes fourth bridge portion 26d which is formed in mesh-like fashion and so as to straddle the interior of fourth region 24e. Employment of such printing plate 80 makes it possible, when electrically conductive paste is applied by moving a squeegee in more or less perpendicular fashion with respect to the longitudinal direction of first output-extracting electrode 4a, to reduce breakage or the like of the printing plate that would otherwise occur when printing is repeated over multiple iterations.

In the present embodiment, fourth bridge portion 26d is formed in such fashion that an acute angle is formed between the direction in which the squeegee is moved and the longitudinal direction of fourth bridge portion 26d, fourth bridge portion 26d being long in shape. Adoption of such an embodiment makes it possible to improve ability of electrically conductive paste to emerge therefrom and to reduce seepage of the electrically conductive paste layer that is formed. When forming first output-extracting electrode 4a of large linewidth, fourth bridge portion 26d may be made cruciform in shape.

As shown at FIG. 13(b), in the present embodiment, portion 29 of fourth region 24e where connection is made to first region 24b is more or less in the shape of an isosceles triangle when viewed as a planar view from the one principal-plane side.

This portion 29 where connection is made to first region 24b is not limited to being of such shape. For example, as shown at FIG. 13(c), an embodiment may be employed wherein portion 29 is in the shape of a polygon in which all interior angles are right angle(s) or obtuse angle(s). Adoption of such an embodiment will make it possible to reduce clogging of electrically conductive paste.

Solar Cell Element Manufacturing Method

Methods associated with the present embodiment for manufacturing first solar cell element 10A and second solar cell element 10B will now be described.

A method for manufacturing semiconductor substrate 1 will first be described. When semiconductor substrate 1 is monocrystalline silicon substrate, the monocrystalline silicon substrate 1 may, for example, be formed using the pulling method or the like. When semiconductor substrate 1 is polycrystalline silicon substrate, the polycrystalline silicon substrate may, for example, be formed using the casting method or the like. In the example described below, p-type polycrystalline silicon is used as semiconductor substrate 1.

First, polycrystalline silicon ingot is, for example, made in accordance with the casting method. This ingot is then sliced, for example, to a thickness of not more than 250 μm. To clean mechanically damaged layers and/or contaminated layers at sliced surfaces of semiconductor substrate 1, NaOH or KOH, or hydrofluoric acid or fluoronitric acid, or the like may thereafter be used to etch a very small amount from the sliced surfaces. Following this etching operation, wet etching may be used to form fine surface irregularities at the surface of semiconductor substrate 1.

In the case of second solar cell element 10B, through-holes 7 are formed between the first surface and the second surface of semiconductor substrate 1. Through-holes 7 may be formed using a mechanical drill, water jet, laser machining device, or the like. If through-holes 7 are formed in such fashion that the machining method is directed from the second-surface side toward the first-surface side of semiconductor substrate 1, this will make it possible to reduce damage to the first surface. However, when employed is a machining method that would cause little damage to semiconductor substrate 1, the machining method may be carried out in such fashion that it is directed from the first-surface side toward the second-surface side. Following formation of through-holes 7, etching may be carried out to remove damaged layers within through-holes 7. Etching may be carried out not only within through-holes 7 but also at the first surface and the second surface.

Next, n-type reverse-conductivity-type layer 2 is formed within a surface layer over a desired region at semiconductor substrate 1. Such reverse-conductivity-type layer 2 may be formed by the coated thermal diffusion method, the gas-phase thermal diffusion method, or the like. As coated thermal diffusion method, a method in which $P_2O_5$ in paste form is applied to the surface of semiconductor substrate 1 and is thermally diffused thereinto may, for example, be cited. As gas-phase thermal diffusion method, a method in which $POCl_3$ (phosphorus oxychloride) in gas form is used as diffusion source may, for example, be cited. This reverse-conductivity-type layer 2 may be formed so as to have depth on the order of 0.2 to 2 μm, and so as to have sheet resistance on the order of 60 to 150 Ω/square. Methods for forming reverse-conductivity-type layer 2 are not limited to the foregoing, it being possible, for example, to employ thin film formation technologies to form hydrogenated amorphous silicon film(s), crystalline silicon film(s) including microcrystalline silicon film(s), and so forth for use as reverse-conductivity-type layer 2. An i-type silicon region may be formed between semiconductor substrate 1 and reverse-conductivity-type layer 2.

Next, antireflective layer 3 is formed over reverse-conductivity-type layer 2. Plasma-enhanced chemical vapor deposition (PECVD), vapor deposition, sputtering, or other such method may be employed to form antireflective layer 3. For example, when PECVD is used to form antireflective layer 3 comprising silicon nitride film, the interior of a reaction chamber may be heated to on the order of 500° C., a gas mixture of silane ($SiH_4$) and ammonia ($NH_3$) may be diluted with nitrogen ($N_2$), and glow discharge decomposition may be employed to cause the various gases to form a plasma which is then reacted to carry out deposition for formation of antireflective layer 3.

Next, BSF region 6, in which semiconductor impurities of one conductivity type are diffused at high concentration, is formed at the second-surface side of semiconductor substrate 1. As method for forming BSF region 6, the following two methods may, for example, be cited. The first method is a method in which it is formed by carrying out thermal diffusion at a temperature on the order of 800 to 1100° C. using boron tribromide ($BBr_3$) as diffusion source. The second method is a method in which it is formed by using printing to apply aluminum paste comprising powdered aluminum, organic vehicle, and so forth, and thereafter carrying out heat treatment (firing) at a temperature on the order of 600 to 850° C. to cause diffusion of aluminum into semiconductor substrate 1. If this second method is used, not only will it be possible to form the desired diffusion region only on the surface where printed, but there will also be no need to remove the n-type reverse-conductivity-type layer formed at the second-surface side during the operation at which formation of reverse-conductivity-type layer 2 was carried out. For this reason, if the second method is used, following formation of the desired diffusion region, in the case of first solar cell element 10A, a laser or the like may be used to carry out pn isolation, which need be carried out only at peripheral locations on the first surface or the second surface; or in the case of second solar cell element 10B, pn isolation may be carried out at the interface between BSF region 6 and third reverse-conductivity-type layer 2c and at peripheral locations on the first surface or the second surface. Methods for forming BSF region 6 are not limited to the foregoing, it being possible, for example, to employ thin film formation technologies to form hydrogenated amorphous silicon film(s), crystalline silicon film(s) including microcrystalline silicon film(s), and so forth for use as BSF region 6. An i-type silicon region may be formed between semiconductor substrate 1 and BSF region 6.

Methods for forming first electrode 4 and second electrode 5 will now be described.

First electrode 4 may be fabricated using electrically conductive paste (silver paste) which includes, for example, metal powder comprising silver (Ag) and/or the like, organic vehicle, and glass frit therein.

In the case of first solar cell element 10A, electrically conductive paste is applied to the first surface of semiconductor substrate 1, and this is thereafter fired for on the order of several tens of seconds to several tens of minutes at a maximum temperature of 600 to 850° C. By so doing, electrically conductive paste is made to penetrate antireflective layer 3 by means of the fire-through method, and first electrode 4 is formed on semiconductor substrate 1.

In the case of second solar cell element 10B, electrically conductive paste is applied to the first surface of semiconductor substrate 1 and is in addition made to fill through-holes 7, and this is thereafter fired for on the order of several tens of seconds to several tens of minutes at a maximum temperature of 600 to 850° C. By so doing, first current-collecting electrodes 4b, auxiliary electrode 4c, and pad electrodes 4e are formed on the first surface; and conduction electrodes 4d are formed at the interiors of through-holes 7. Then, electrically conductive paste is applied to the second surface of semiconductor substrate 1, and this is thereafter fired for on the order of several tens of seconds to several tens of minutes at a maximum temperature of 500 to 850° C. to form first output-extracting electrodes 4a on the second surface.

In the cases of both first solar cell element 10A and second solar cell element 10B, after application of electrically conductive paste and before firing, solvent may be evaporated at prescribed temperature to make the electrically conductive paste dry. As application method, screen printing or the like may be employed. Detailed description will be given below regarding a method for forming first electrode 4 using printing plate 20.

Next, description will now be carried out with respect to second electrode 5. Second current-collecting electrode 5b may first be fabricated using, for example, aluminum paste which includes aluminum powder and organic vehicle therein. This aluminum paste is applied approximately everywhere on the second surface except for first electrode 4 and part of where second output-extracting electrode 5a will be formed. As application method, screen printing or the like may be employed. Following application of aluminum paste in this manner, solvent may be evaporated at prescribed temperature to make the aluminum paste dry, in which case the aluminum paste will be less likely to adhere to other locations when operations are being carried out, increasing efficiency of operations.

Next, second output-extracting electrode 5a may be fabricated using electrically conductive paste (silver paste) which includes, for example, metal powder comprising silver powder and/or the like, organic vehicle, and glass frit therein. This electrically conductive paste is applied in a predetermined configuration on the second surface of semiconductor substrate 1. Application of electrically conductive paste at location(s) where it comes in partial contact with aluminum paste causes second output-extracting electrode 5a and second current-collecting electrode 5b to partially overlap. As application method, screen printing or the like may be employed. Following application thereof, solvent may be evaporated at prescribed temperature to make the electrically conductive paste dry.

Semiconductor substrate 1 is fired within a firing furnace for on the order of several tens of seconds to several tens of minutes at a maximum temperature of 600 to 850° C. to form second electrode 5 on the second surface of semiconductor substrate 1

Whereas the aforementioned embodiment was described in terms of an example in which first output-extracting electrode 4a, conduction electrode 4d, and second electrode 5 were formed by an electrode formation method involving printing and firing, it is also possible to employ thin film forming method such as vapor deposition and sputtering, and plating method.

Printing operations carried out during operations for forming first electrode 4 will now be described in more specific terms.

<Operations for Printing First Electrode 4 Associated with the First Embodiment>

In the printing operations associated with the present embodiment, the aforementioned printing plate 20 associated with the first embodiment is used to carry out printing of first electrode 4. That is, description will be given with respect to printing operation A (first printing operation) for first electrode 4 including first current-collecting electrode 4b.

Printing plate 20 including first penetration portion 24 and second penetration portion 25 in a pattern corresponding to the configuration of the first current-collecting electrodes 4b that will be formed on one principal plane of semiconductor substrate 1 is first prepared. Next, printing plate 20 is placed on the one principal plane of semiconductor substrate 1 in such fashion that buffer layer 23 is facing down. Electrically conductive paste is then placed on the top of printing plate 20, and a squeegee is moved in parallel fashion with respect to the longitudinal direction of first current-collecting electrode 4b. This causes electrically conductive paste to pass through first penetration portion 24 and second penetration portion 25 of printing plate 20 as it is printed with desired configuration onto the one principal plane of semiconductor substrate 1.

<Operations for Printing First Electrode 4 Associated with the Second Embodiment>

In the printing operations associated with the present embodiment, the aforementioned printing plate 40 associated with the third embodiment is used to carry out printing of first electrode 4. That is, description will be given with respect to printing operation B for first electrode 4 including first current-collecting electrode 4b and auxiliary electrode 4c.

For example, printing plate 40 shown at FIG. 9(a) may be used to form first current-collecting electrode 4b and auxiliary electrode 4c. More specifically, printing plate 40 including first penetration portion 24 and second penetration portion 25 in a pattern corresponding to the configuration of first current-collecting electrodes 4b and auxiliary electrode 4c is first prepared. First current-collecting electrode 4b and auxiliary electrode 4c are printed using similar procedure as at the aforementioned printing operation A for first current-collecting electrode 4b using printing plate 20.

First electrode 4 comprising first current-collecting electrode 4b and auxiliary electrode 4c is not limited to embodiments in which first current-collecting electrode 4b and auxiliary electrode 4c are printed in a single operation and are thereafter fired such as is the case in the present embodiment. For example, printing operation B for first electrode 4 comprising first current-collecting electrode 4b and auxiliary electrode 4c may include a first operation in which first current-collecting electrode 4b is printed, and a second operation in which auxiliary electrode 4c is printed. In the case, while there is no particular limitation with respect to the order of the first operation and the second operation, carrying out the second operation after first operation will make it possible to reduce occurrence of electrical opens at first current-collecting electrode 4b. During either operation, a squeegee may be moved in parallel fashion with respect to the respective longitudinal direction of first current-collecting electrode 4b and auxiliary electrode 4c.

As shown at FIG. 9(b), at the present printing operation B, printing of first electrode 4 is carried out using the aforementioned printing plate 40 in which width W2 of the opening at the buffer-layer 23 side of second region 24c is larger than width W1 of the opening at the buffer-layer 23 side of first region 24b. Employment of such printing plate 40 makes it possible to reduce occurrence of electrical opens at auxiliary electrode 4c even when electrically conductive paste has been applied by moving a squeegee in the longitudinal direction of first current-collecting electrode 4b.

In addition, as has been described, as shown at FIG. 9(b), printing plate 40 includes a constitution in which, in the vicinity of where first region 24b and second region 24c come into mutual proximity, width W1 of the opening at the buffer-layer 23 side of first region 24b grows larger as one approaches second region 24c. The foregoing mutually proximate location corresponds to location(s) at which connection (s) are formed between first current-collecting electrode 4b and auxiliary electrode 4c. Carrying out printing using printing plate 40 having the foregoing constitution tends to facilitate emergence of electrically conductive paste at the foregoing mutually proximate location. This makes it possible to reduce occurrence of electrical opens due to printing defects.

As has been described, printing plate 40, as was the case with printing plate 20, includes bridge(s) 26. Bridge 26 at printing plate 40 is constituted such that it comprises first bridge portion 26a which straddles the interior of first region 24b in the width direction, and second bridge portion 26b which straddles the interior of second region 24c in the width direction. Width of second bridge portion 26b is larger than width of first bridge portion 26a.

At the present printing operation B, electrically conductive paste may be applied by moving a squeegee along the longitudinal direction of first current-collecting electrode 4b from an auxiliary electrode 4c at one end toward an auxiliary electrode 4c at the other end. In such case, the pressure imparted by the squeegee to printing plate 40 will increase near where printing begins and near where printing finishes. Because the aforementioned printing plate 40 is therefore such that strength is high at second bridge portion 26b, where pressure from the squeegee is comparatively large, there is reduction in breakage and the like of printing plate 40 that would otherwise occur when printing is repeated over multiple iterations, and reliability of electrode formation is increased.

At either the aforementioned printing operation A or the aforementioned printing operation B, when first electrode 4 includes first output-extracting electrode 4a, first output-extracting electrode 4a may be formed as follows.

In the case of first solar cell element 10A, the electrically conductive paste layer(s) that will become first output-extracting electrode 4a may be formed after formation of the electrically conductive paste layer(s) that will become first current-collecting electrode 4b as at printing operation A, or after formation of the electrically conductive paste layer(s) that will become first current-collecting electrode 4b and auxiliary electrode 4c as at printing operation B. At this time, the electrically conductive paste layer(s) that will become first output-extracting electrode 4a may be printed at the same operation at which the electrically conductive paste layer(s) that will become first current-collecting electrode 4b and auxiliary electrode 4c are printed using the aforementioned printing plate 80. Or the electrically conductive paste layer(s) that will become first output-extracting electrode 4a may be formed separately from the operation at which the electrically conductive paste layer(s) that will become first current-collecting electrode 4b and auxiliary electrode 4c are printed, by carrying out a screen printing operation employing a mesh printing plate comprising a mesh screen, or by carrying out a formation operation employing a dispenser or the like.

Formation of the electrically conductive paste layer(s) that will become first output-extracting electrode 4a may take place before formation of the electrically conductive paste layer(s) that will become first current-collecting electrode 4b, or the electrically conductive paste layer(s) that will become first current-collecting electrode 4b and auxiliary electrode 4c. Conversely, the electrically conductive paste layer(s) that will become first output-extracting electrode 4a may be formed after formation of the electrically conductive paste layer(s) that will become first current-collecting electrode 4b, or the electrically conductive paste layer(s) that will become first current-collecting electrode 4b and auxiliary electrode 4c. In such case, it will be possible to reduce occurrence of electrical opens at first current-collecting electrode 4b.

After carrying out either of the aforementioned operations, first electrode 4 may be formed by firing the electrically conductive paste layer(s) that will become first output-extracting electrode 4a, first current-collecting electrode 4b, and auxiliary electrode 4c.

There is no objection, in another embodiment, to using a mesh printing plate comprising a mesh screen, for example, to form the paste layer(s) that will become first output-extracting electrode 4a, first current-collecting electrode 4b, and auxiliary electrode 4c, and thereafter using printing plate 40, electrically conductive paste can be applied to form first current-collecting electrode 4b and auxiliary electrode 4c. By carrying out printing over multiple iterations in this fashion, it will be possible to form first electrode 4 with large thickness, and it will be possible to reduce electrode resistance. In the case of printing plate 40, even when the foregoing printing plate is arranged over a printing target on which an electrically conductive paste layer includes already been formed and printing is repeatedly carried out, there will be little tendency for delamination of buffer layer 23 to occur.

At this time, it is preferred that hardness of the buffer layer 23 at a printing plate 40 being used for the second and subsequent iterations be greater than hardness at a printing plate being used for the first iteration. By so doing, when the buffer layer 23 and the electrically conductive paste layer(s) that have already been printed come in contact at the time of the second printing iteration, this will make it possible to reduce damage incurred by and chipping of buffer layer 23. As a result, it will be possible to reduce breakage or the like of printing plate 40 that would otherwise occur when printing is repeated over multiple iterations.

Hardness of buffer layer 23 may be not less than H and not more than 6H in terms of pencil hardness. This will make it possible to reduce damage and chipping of buffer layer 23 by the electrically conductive paste layer(s) that have already been printed.

At this time, it is preferred that width D3 of the buffer layer 23 at a printing plate 40 being used for the second and subsequent iterations be greater than width D3 of the buffer layer at a printing plate being used for the first iteration. This will make it possible to reduce damage and chipping of buffer layer 23 by the electrically conductive paste layer(s) that have already been printed, and will make it possible to reduce breakage or the like of printing plate 40 that would otherwise occur when printing is repeated over multiple iterations.

<Operations for Printing First Electrode 4 Associated with the Third Embodiment>

In the printing operations associated with the present embodiment, the aforementioned printing plate 60 associated with the fifth embodiment is used to carry out printing of first electrode 4. That is, description will be given with respect to printing operation C which is carried out when forming first electrode 4 of second solar cell element 10B.

More specifically, printing operation C includes an operation, using printing plate 60, for forming electrically conductive paste layer(s) that will become first electrode 4 (first current-collecting electrode 4b, auxiliary electrode 4c, and pad electrode 4e). That is, electrically conductive paste layer(s) that will become first current-collecting electrode 4b, auxiliary electrode 4c, and pad electrode 4e may be formed in a single printing operation. At this time, the electrically conductive paste layer(s) that will become conduction electrode 4d may also be formed in this same single printing operation as has been described. By thereafter firing the electrically conductive paste layer(s) so formed that will become first current-collecting electrode 4b, auxiliary electrode 4c, pad electrode 4e, and conduction electrode 4d, it is possible to form first electrode 4 at the first-surface side and at the interior of through-holes 7.

Printing operation C may include a first operation in which printing plate 40 is used to form the electrically conductive paste layer(s) that will become first current-collecting electrode 4b and auxiliary electrode 4c, and a second operation in which, following the first operation, printing plate 60' is used to form the electrically conductive paste layer(s) that will become first current-collecting electrode 4b, auxiliary electrode 4c, and pad electrode 4e. Or printing operation C may include a third operation in which printing plate 60' is used to form the electrically conductive paste layer(s) that will become first current-collecting electrode 4b, auxiliary electrode 4c, and pad electrode 4e, and a fourth operation in which, following the third operation, printing plate 60 is used to form the electrically conductive paste layer(s) that will become first current-collecting electrode 4b, auxiliary electrode 4c, pad electrode 4e, and conduction electrode 4d. By carrying out printing over multiple iterations in this fashion, it will be possible to form first electrode 4 with large thickness, and it will be possible to reduce electrode resistance. In the case of the aforementioned printing plate 60 or printing plate 60', even when the foregoing printing plate 60 or printing plate 60' is arranged over a printing target on which an electrically conductive paste layer has already been formed during the first operation or the third operation and printing is repeatedly carried out, there will be little tendency for delamination of buffer layer 23 to occur. At printing plate 60', first penetration portion 24 is formed so as to provide a donut-shaped electrically conductive paste layer which is present only at locations corresponding to the periphery of through-hole 7. For this reason, it will be possible to avoid filling the interior of through-hole 7 with electrically conductive paste at pad electrode 4e. As shown in FIG. 11, at printing plate 60', circular metal plate 21 and buffer layer 23 are provided at locations corresponding to through-holes 7, and bridge 26 is formed so as to be cruciform in shape. Using printing plate 60' of such configuration to apply electrically conductive paste makes it possible to improve ability of electrically conductive paste to emerge therefrom and to reduce seepage of the electrically conductive paste layer that is formed.

<Operations for Printing First Electrode 4 Associated with the Fourth Embodiment>

In the printing operations associated with the present embodiment, the aforementioned printing plate 70 associated with the sixth embodiment is used to carry out printing of first electrode 4.

Printing operation D for first electrode 4 associated with the fourth embodiment includes an operation (second printing operation) for printing electrically conductive paste that will become alignment mark(s) 8 for alignment of solar cell element(s) on the first principal plane. Printing operation D associated with the present embodiment may be carried out to provide one principal plane of semiconductor substrate 1 with alignment mark(s) 8 such as may be used for alignment of solar cell element(s) such as those shown for example in FIG. 1 or FIG. 4; for example, when the alignment mark(s) are to be formed with circular shape. More specifically, printing plate 70 shown in FIG. 12 may be used to print alignment mark(s) 8. In the present embodiment, electrically conductive paste may be printed by moving a squeegee in a direction which forms an acute angle with the longitudinal direction of third bridge portion 26c, third bridge portion 26c being long in shape. Adoption of such an embodiment makes it possible to reduce seepage at the paste layer which is formed, and makes it possible to improve strength of third bridge portion 26c.

<Operations for Printing First Electrode 4 Associated with the Fifth Embodiment>

In the printing operations associated with the present embodiment, the aforementioned printing plate 80 associated with the seventh embodiment is used to carry out printing of first electrode 4.

Printing operation E for first electrode 4 associated with the fifth embodiment includes an operation (second printing operation) for printing electrically conductive paste that will become first output-extracting electrode(s) 4a, which is/are provided in direction(s) perpendicular to first current-collecting electrode(s) 4b and which is/are connected to first current-collecting electrode(s) 4b, on the first principal plane. More specifically, second printing operation in the present embodiment is an operation in which, at first solar cell element 10A, printing plate 80 including first penetration portion 24 corresponding to first output-extracting electrode 4a, first current-collecting electrode 4b, and auxiliary electrode 4c is used to carry out printing of electrically conductive paste onto semiconductor substrate 1. As shown in FIG. 13, printing plate 80 is such that fourth bridge portion 26d for forming first output-extracting electrode 4a is formed in mesh-like fashion and so as to straddle the interior of first penetration portion 24. This being the case, when electrically conductive paste is applied by moving a squeegee in more or less perpendicular fashion with respect to the longitudinal direction of first output-extracting electrode 4a, it will be possible to reduce breakage or the like of printing plate 40 that would otherwise occur when printing is repeated over multiple iterations. In the present embodiment, because fourth bridge portion 26d is formed so as to be of cruciform shape inclined with respect to the direction in which first region 24b extends, electrically conductive paste may be printed by moving a squeegee in such fashion that the angle formed with the longitudinal direction of fourth bridge portion 26d, fourth bridge portion 26d being long in shape, is an acute angle. For this reason, even when forming electrodes having large linewidth, it will be possible to improve ability of electrically conductive paste to emerge therefrom and to reduce seepage of the electrically conductive paste layer that is formed.

The present invention is not limited to the foregoing embodiments, but a great many revisions and variations can be admitted within the scope of the present invention. It goes without saying that included within the scope of the present invention are various combinations of the embodiments that have been described above.

EXPLANATION OF REFERENCE NUMERALS

1: Semiconductor substrate
2: Reverse-conductivity-type layer
3: Antireflective layer
4: First electrode
4a: First output-extracting electrode
4b: First current-collecting electrode
4c: Auxiliary electrode
4d: Via electrode
4e: Pad electrode
5: Second electrode
5a: Second output-extracting electrode
5b: Second current-collecting electrode
6: BSF region
7: Through-hole
8: Alignment mark
10a: First solar cell element
10b: Second solar cell element
21: Metal plate
22: Frame
23: Buffer layer
24: First penetration region
24a: Rim of opening
24b: First region
24c: Second region
24d: Third region
24e: Fourth region
25: Second penetration region
25a: Rim of opening
26: Bridge
26a: First bridge portion
26b: Second bridge portion
26c: Third bridge portion
26d: Fourth bridge portion
28: Slit

The invention claimed is:

1. A printing plate comprising:
   a metal plate;
   a buffer layer arranged on a principal plane of the metal plate; and
   a slit that penetrates the metal plate and the buffer layer;
   wherein the slit comprises:
      a first penetration portion disposed in penetrating the metal plate;
      a second penetration portion disposed in the buffer layer; and
      a bridge that straddles an interior of the first penetration portion; and wherein,
      when viewed as a planar view from the principal-plane side, a rim of an opening at the buffer-layer side of the first penetration portion is inwardly disposed relative to a rim of an opening at the metal-plate side of the second penetration portion.

2. The printing plate according to claim 1, wherein, when viewed as a planar view from the principal-plane side, a surface on the principal-plane side of the bridge is exposed at an interior of the second penetration portion.

3. The printing plate according to claim 1, wherein the metal plate comprises an irregular surface at the principal plane thereof.

4. The printing plate according to claim 1, wherein the slit comprises:
   a plurality of first slits in which end portions at one end thereof and end portions at an other end thereof are arrayed together; and
   a second slit being connected to at least either the end portions at one end or the end portions at the other end of adjacent ones of the first slits, and
   the first penetration portion comprises:
      a first region that opens in narrowly elongated fashion in a longitudinal direction at the first slit; and
      a second region that opens in narrowly elongated fashion in a longitudinal direction at the second slit, wherein
      a width of an opening at the buffer-layer side of the second region is larger than a width of an opening at the buffer-layer side of the first region.

5. The printing plate according to claim 4, wherein
   the first region and the second region come into mutual proximity at a location where the first slit and the second slit are connected;
   in a vicinity of the location where the first region and the second region come into mutual proximity, a width of an opening at the buffer-layer side of the first region grows larger as one approaches the second region.

6. The printing plate according to claim 4, wherein the bridge comprises:
   a first bridge portion that straddles the first region in a width direction, and
   a second bridge portion that straddles the second region in a width direction; and
   a width of the second bridge portion is larger than a width of the first bridge portion.

7. The printing plate according to claim 4, wherein
   the bridge comprises a plurality of first bridge portions,
   a distance between adjacent ones of the first bridge portions grows smaller as one approaches the second region,
   a second bridge portion that straddles the second region in a width direction; and
   a width of the second bridge portion is larger than a width of the first bridge portion.

8. The printing plate according to claim 4, wherein
   the bridge comprises a plurality of first bridge portions;
   a distance to the second region from the first bridge portion that is closest to the second region is not less than a distance between adjacent ones of the first bridge portions,
   a second bridge portion that straddles the second region in a width direction; and
   a width of the second bridge portion is larger than a width of the first bridge portion.

9. A method for manufacturing a solar cell element, the method comprising printing first electrically conductive paste that will become a plurality of linearly shaped current-collecting electrodes onto a first principal plane of a semiconductor substrate by using a printing plate according to claim 1.

10. The method according to claim 9, the method further comprising printing second electrically conductive paste onto the first principal plane by moving a squeegee in a direction which forms an acute angle with a longitudinal direction of the bridge to be an acute angle, the second electrically conductive paste becoming at least one of:
   an alignment mark for alignment of a solar cell element; and
   an output-extracting electrode which is provided in a direction perpendicular to the current-collecting electrodes and which is connected to the current-collecting electrodes,
   in which the first penetration portion of the printing plate further comprises: a region corresponding to at least one of the alignment mark and the output-extracting electrode.

11. A method for manufacturing a solar cell element, the method comprising:
   printing first and second electrically conductive pastes, with using a printing plate according to claim 4, onto a first principal plane of a semiconductor substrate,
   the first electrically conductive paste becoming a plurality of linearly shaped current-collecting electrodes, and
   the second electrically conductive paste becoming a linearly shaped auxiliary electrode that interconnects at least one of end portions at one end of adjacent ones of the current-collecting electrodes and end portions at an other end of adjacent ones of the current-collecting electrodes.

* * * * *